(12) United States Patent
Yu et al.

(10) Patent No.: US 7,229,871 B2
(45) Date of Patent: Jun. 12, 2007

(54) INTEGRATED CIRCUIT CONTAINING POLYSILICON GATE TRANSISTORS AND FULLY SILICIDIZED METAL GATE TRANSISTORS

(75) Inventors: Shaofeng Yu, Plano, TX (US); Benjamin P. McKee, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/553,839

(22) Filed: Oct. 27, 2006

(65) Prior Publication Data

US 2007/0042535 A1   Feb. 22, 2007

Related U.S. Application Data

(62) Division of application No. 11/074,177, filed on Mar. 7, 2005, now Pat. No. 7,148,097.

(51) Int. Cl.
*H01L 21/8238* (2006.01)

(52) U.S. Cl. .............. 438/199; 438/229; 438/233; 257/E21.637

(58) Field of Classification Search .......... 438/199, 438/200, 229–233, 592, 585, 664
See application file for complete search history.

(56) References Cited

U.S. PATENT DOCUMENTS 6,890,823 B2*  5/2005  Lee et al. ............... 438/300
6,905,922 B2*  6/2005  Lin et al. ............... 438/199
6,929,992 B1*  8/2005  Djomehri et al. ........ 438/199
6,977,194 B2* 12/2005  Belyansky et al. ...... 438/197
2006/0084247 A1*  4/2006  Liu .......................... 438/510
2006/0121663 A1*  6/2006  Fang et al. .............. 438/199

OTHER PUBLICATIONS

Haowen Bu, et al. "A Semiconductor Device Having a Fully Silicided Gate Electrode and Method of Manufacture Therefor" U.S. Appl. No. 10/808,168, filed Mar. 24, 2004.

Jiong-Ping Lu, et al. "A Method for Manufacturing a Semiconductor Device Having a Silicided Gate Electrode and a Method for Manufacturing an Integrated Circuit Including the Same" U.S. Appl. No. 10/810,759, filed Mar. 26, 2004.

Shaofeng Yu, et al. "A Method for Manufacturing a Silicided Gate Electrode Using a Buffer Layer" U.S. Appl. No. 11/007,569, filed Dec. 8, 2004.

* cited by examiner

*Primary Examiner*—Michael Trinh
(74) *Attorney, Agent, or Firm*—Rose Alyssa Keagy; W. James Brady; Frederick J. Telecky, Jr.

(57) ABSTRACT

A method for manufacturing an integrated circuit 10 having transistors 20, 30 of two threshold voltages where protected transistor stacks 270 have a gate protection layer 220 that are formed with the use of a single additional mask step. Also, an integrated circuit 10 having at least one polysilicon gate transistor 20 and at least one FUSI metal gate transistor 30.

18 Claims, 14 Drawing Sheets

INTEGRATED CIRCUIT CONTAINING POLYSILICON GATE TRANSISTORS AND FULLY SILICIDIZED METAL GATE TRANSISTORS

This is a division of application Ser. No. 11/074,177, filed Mar. 7, 2005, now U.S. Pat. No. 7,148,097.

BACKGROUND OF THE INVENTION

This invention relates to the fabrication and structure of integrated circuits containing both polysilicon gate transistors and fully silicidized ("FUSI") metal gate transistors.

DETAILED DESCRIPTION OF THE INVENTION

Figure 1:
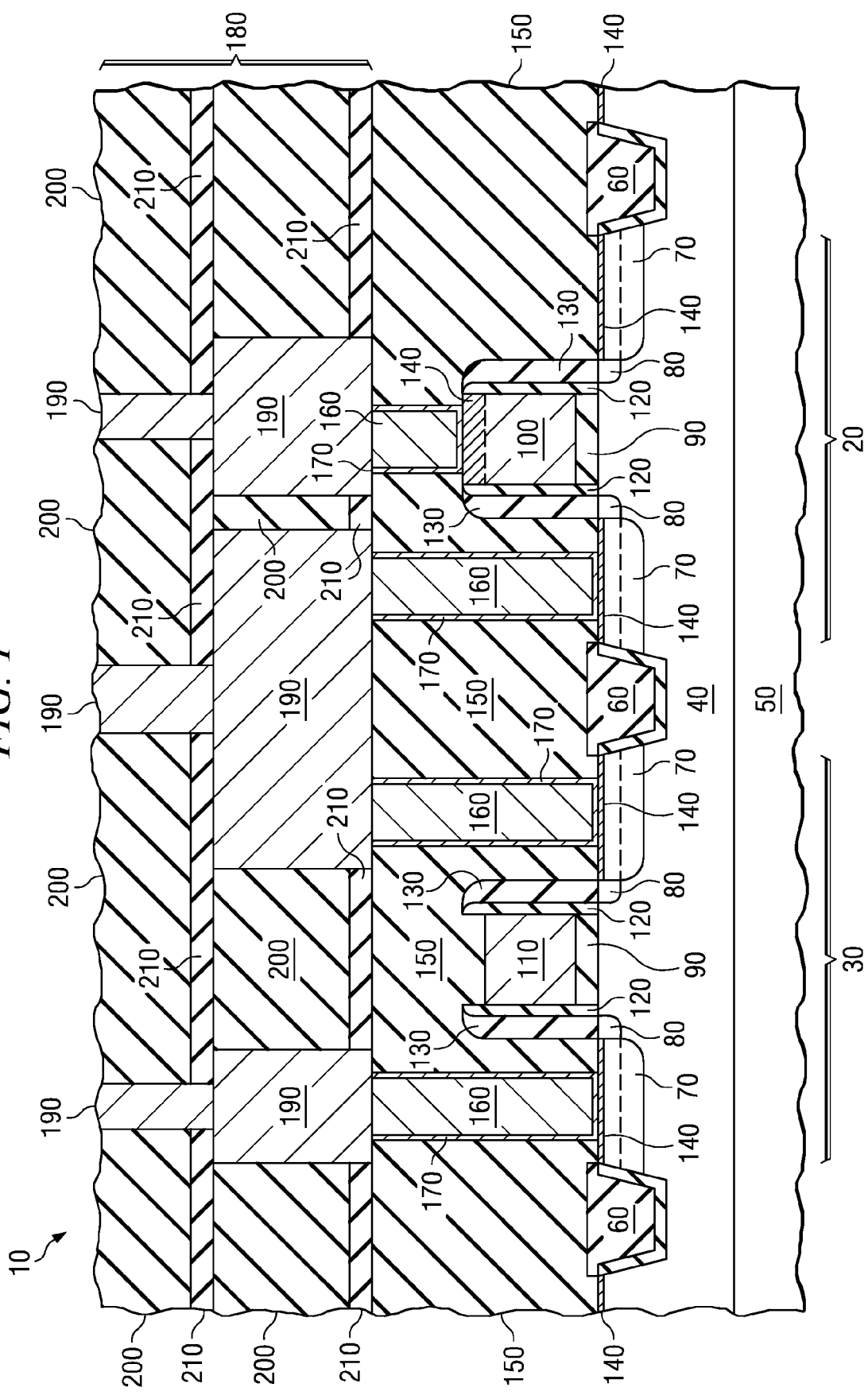
FIG. 1 is a cross-sectional view of an integrated circuit in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of an integrated circuit 10 in accordance with the present invention. In the example application, CMOS transistors 20, 30 are formed within an n-well or p-well region 40 of a semiconductor substrate 50. It is within the scope of the invention for the remainder of the integrated circuit 10 to contain any combination of additional active or passive devices (not shown), such as additional MOSFET, BICMOS and bipolar junction transistors, capacitors, optoelectronic devices, inductors, resistors, or diodes.

The semiconductor substrate 50 is a single-crystalline substrate that is doped to be n-type or p-type; however, it may be an amorphous silicon substrate or a substrate that is fabricated by forming an epitaxial silicon layer on a single-crystal substrate. The CMOS transistors 20, 30 are electrically insulated from other active devices by shallow trench isolation structures 60 formed within the semiconductor substrate 50; however, any conventional isolation structures may be used such as field oxide regions or implanted isolation regions.

In general, transistors 20, 30 are comprised of a gate, source, and drain. More specifically, as shown in FIG. 1, the active portion of the transistors are comprised of sources/drains 70, source/drain extensions 80, and a gate that is comprised of a gate oxide 90 and gate electrode 100/110. The CMOS transistors 20, 30 may be either a p-channel MOS transistor ("PMOS") or an n-channel MOS transistor ("NMOS").

In the example application shown in FIG. 1, transistors 20 and 30 are PMOS transistors. Therefore they are formed within an n-well region 40 of the semiconductor substrate 50. In addition, the deep sources and drains 70 and the source and drain extensions 80 have p-type dopants such as boron. The sources/drains 70 are usually heavily doped. However, the source/drain extensions 80 may be lightly doped ("LDD"), medium doped ("MDD"), or highly doped ("HDD").

The gates of the PMOS transistors 20, 30 are created from a gate oxide dielectric 90 plus a p-type doped polysilicon gate electrode 100 or a fully silicidized gate electrode 110 ("FUSI"). This use of both polysilicon gate electrodes 100 and fully silicidized gate electrodes 110 in the same integrated circuit accommodates circuit designs requiring transistors that have one of tow threshold voltages on the same integrated circuit 10.

One skilled in the art understands that the transistors 20, 30 could also be NMOS transistors without departing from the scope of the invention. In this alternative embodiment each of the dopant types described throughout the remainder of this document would be reversed. For example, NMOS transistors 20, 30 would be formed within a p-well region 40 of the semiconductor substrate 50. In addition, the deep sources and drains 70 and the source and drain extensions 80 would have n-type dopants such as arsenic, phosphorous, antimony, or a combination of n-type dopants. The sources/drains 70 of NMOS transistors 20, 30 would also be heavily doped. However, the source/drain extensions 80 could be LDD, MDD, or HDD. The gate of the NMOS transistors would be created from a gate oxide dielectric 90 plus a p-type doped polysilicon gate electrode 100 or a fully silicidized gate electrode 110. For clarity, this opposite structure will not be discussed in detail since it is well known how to reverse the dopant types to create an NMOS transistor that is the counterpart to the PMOS transistor described herein.

Referring again to FIG. 1, an offset structure comprising extension sidewalls 120 and spacer sidewalls 130 are used during fabrication to enable the proper placement of the source/drain extensions 80 and the sources/drains 70, respectively. More specifically, the source/drain extensions 80 are usually formed using the gate stack (90, 100/110) and the extension sidewalls 120 as a mask. In addition, the sources/drains 70 are usually formed with the gate stack (90, 100/110) and the spacer sidewalls 130 as a mask.

In this example application, the sources/drains 70 have a layer of silicide 140 that is formed within the top surface of the sources/drains 70 during the fabrication process (as described below). This silicide layer 140 formed within the top surface of the sources/drains 70 is preferably $CoSi_2$; however, it is within the scope of the invention to fabricate the silicide 140 with other metals (such as nickel, platinum, titanium, tantalum, molybdenum, tungsten, or alloys of these metals). In addition, the silicide layer 140 formed on the top surface of the sources/drains 70 may be a self-aligned silicide (i.e. a "salicide")

In accordance with the invention, the gate electrodes 100/110 are either partially or fully silicidized during the semiconductor fabrication process described below. More specifically, the polysilicon gate transistor 20 has a partially silicidized gate electrode 100 while the fully silicidized metal gate transistor 30 has a gate electrode 110 that is fully silicidized. A benefit of the silicide formed within the gate electrode 100/110 and the top portion of the sources/drains 70 is the reduction of the contact resistance between the transistors 20, 30 and the electrical contacts 160/170. In the example application, the polycrystalline silicon (i.e. "polysilicon" or "poly") gate electrode 100 is preferably $CoSi_2$: however, it is within the scope of the invention to fabricate the silicide 100 with other metals, such as nickel, platinum, titanium, tantalum, molybdenum, tungsten, or alloys of these metals. In contrast, the FUSI gate electrode silicide 110 is preferably comprised of NiSi; however, other metals may be used, such as cobalt, platinum, titanium, tantalum, molybdenum, tungsten, or an alloy.

The integrated circuit 10 has a layer of dielectric insulation 150 that surrounds the CMOS transistors 20, 30. The composition of dielectric insulation 150 may be any suitable material such as $SiO_2$ or organosilicate glass ("OSG"). The dielectric material 150 electrically insulates the metal contacts 160/170 that electrically connect the CMOS transistors 20, 30 that are shown in FIG. 1 to other active or passive devices (not shown) that are located throughout the integrated circuit 10. An optional dielectric liner (not shown) may be formed immediately below the dielectric insulation layer 150. If used, the dielectric liner may be any suitable material such as silicon nitride.

In this example application, the contact cores 160 are comprised of W; however, any suitable material (such as Cu, Ti, Al, or an alloy) may be used. In addition, an optional liner material 170 such as Ti, TiN, or Ta (or any combination or layer stack thereof) may be used to reduce the contact resistance at the interface between the liner 170 and the silicidized regions of the poly gate electrode 100 and sources/drains 140.

Subsequent fabrication will create the "back-end" portion 180 of the integrated circuit. The back-end 180 is generally comprised of one or more interconnect layers (and possibly via layers) containing metal interconnects 190 that properly route electrical signals and power through out the completed integrated circuit. The metal interconnects 190 may contain any suitable metal such as copper. In addition, the metal interconnects 190 are electrically insulated by dielectric material 200, which may be any insulative material such as fluorinated silica glass ("FSG") or OSG. Moreover, a thin dielectric layer 210 may be formed between the areas of dielectric material 200 of each interconnect layer. If used, the thin dielectric layer 210 may be comprised of any suitable material, such as SiC, SiCN, SiCO, or $Si_3N_4$. The very top portion of the back-end 180 (not shown) contains bond pads to connect the integrated circuit 10 to the device package plus an overcoat layer to seal the integrated circuit 10.

Figure 2A:
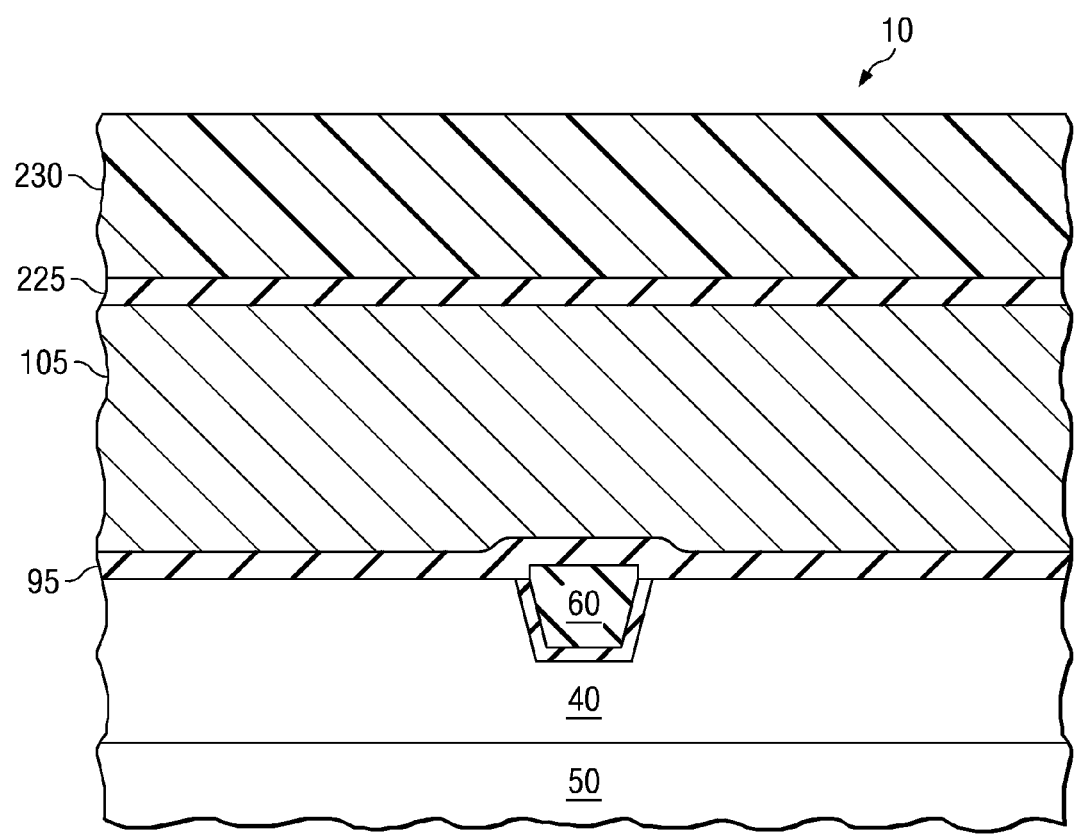
FIGS. 2A-2N are cross-sectional diagrams of a process for forming a poly gate transistor and a FUSI gate transistor in accordance with the present invention.
Figure 2B:
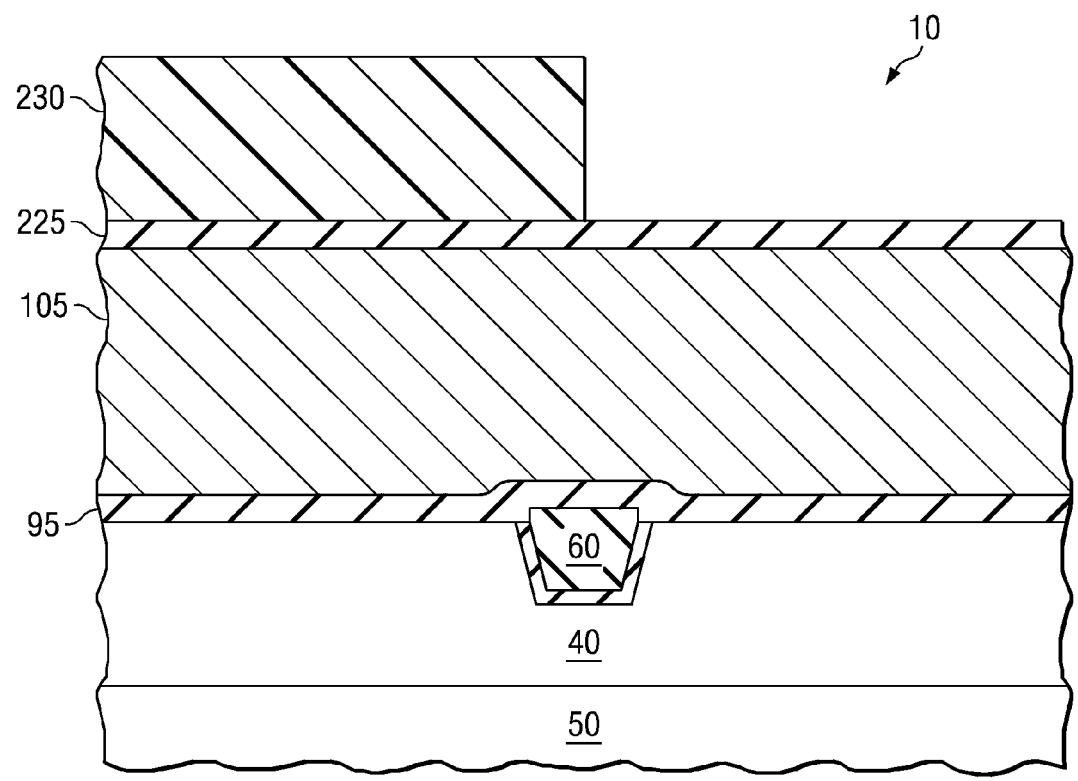
Figure 2C:
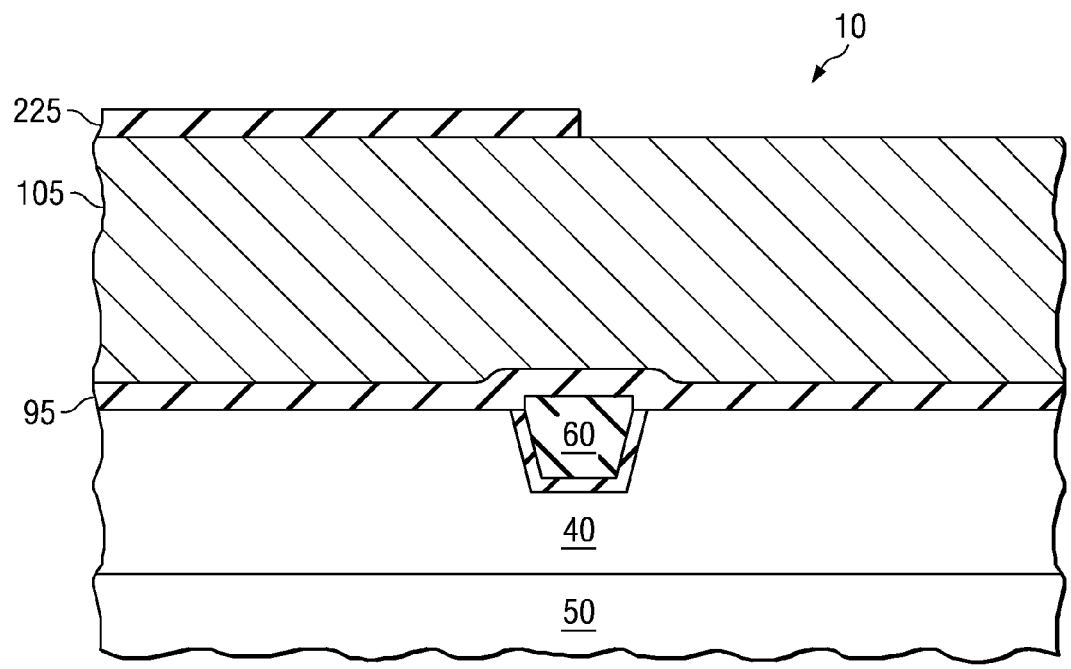
Figure 2D:
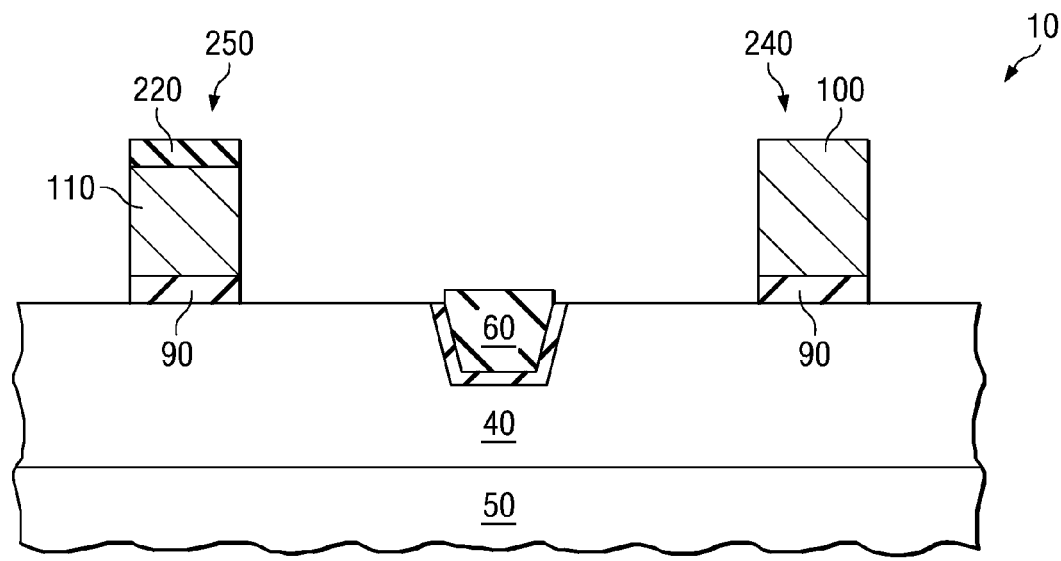
Figure 2E:
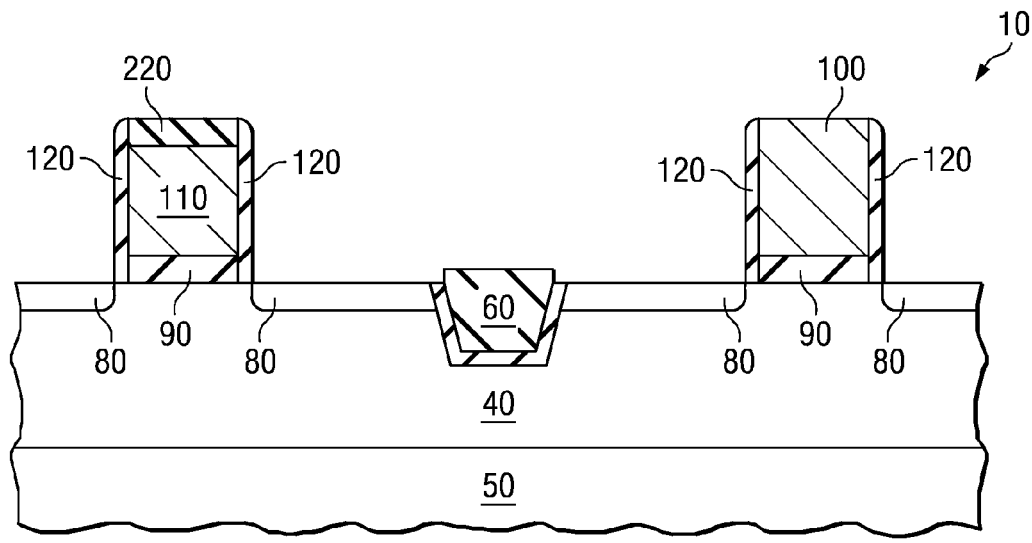
Figure 2F:
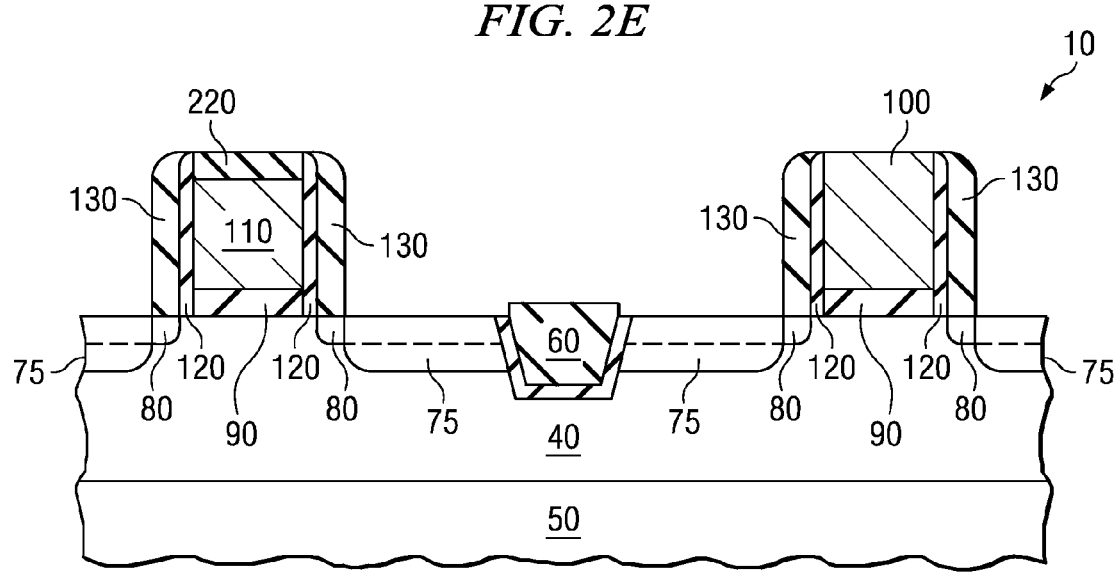
Figure 2G:
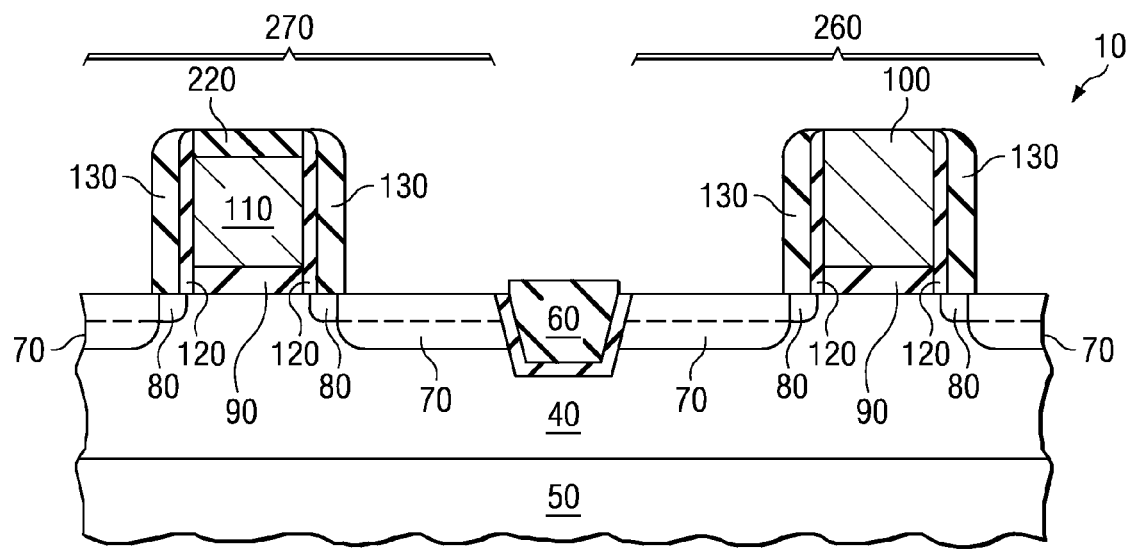
Figure 2H:
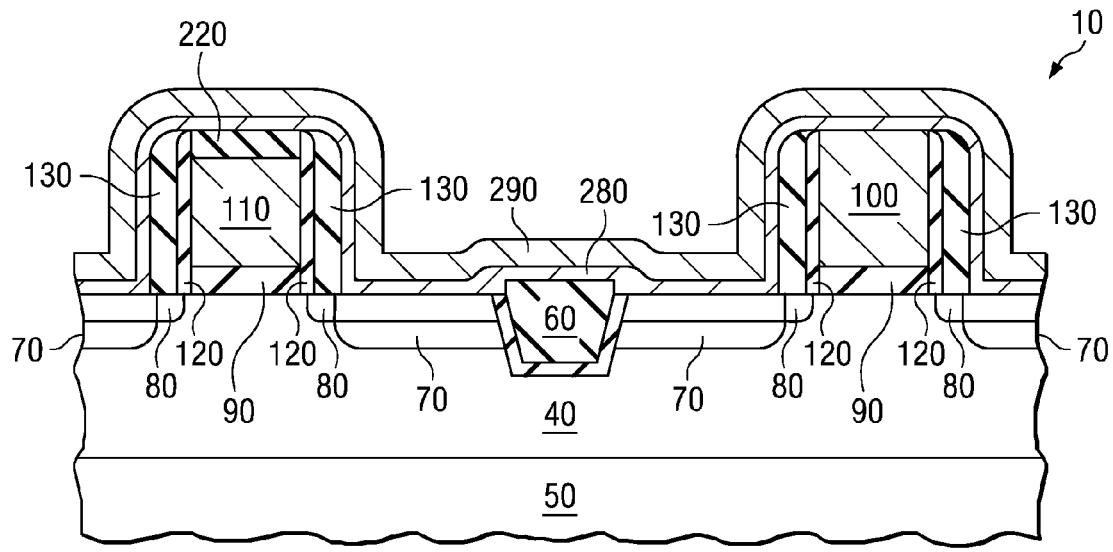
Figure 2I:
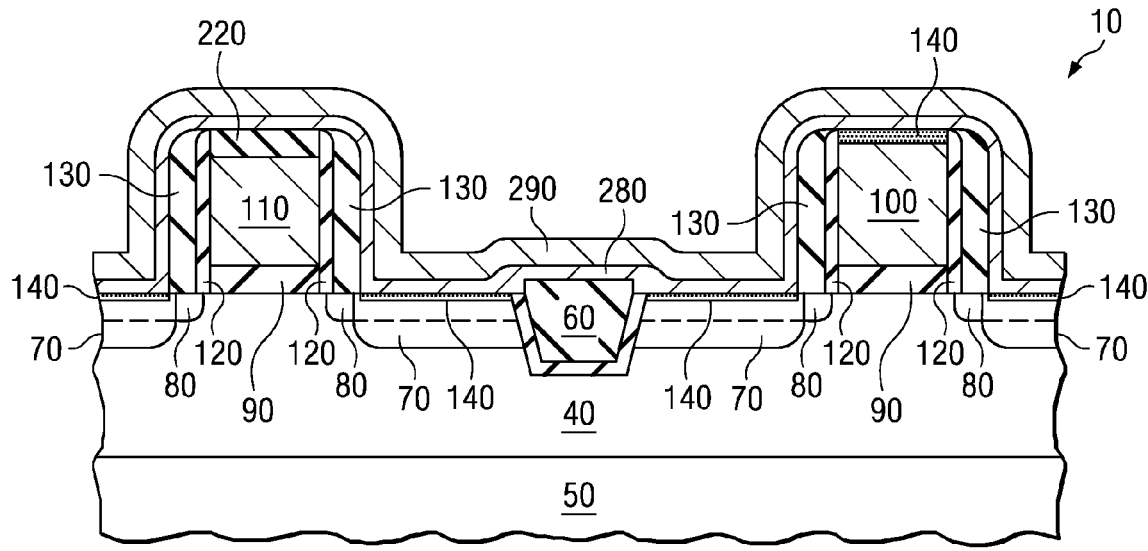
Figure 2J:
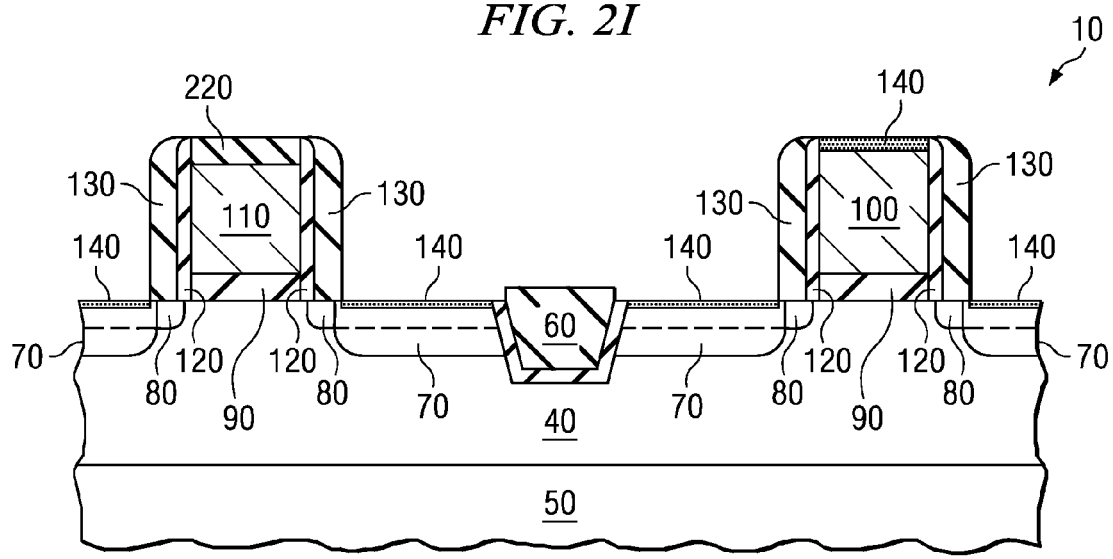
Figure 2K:
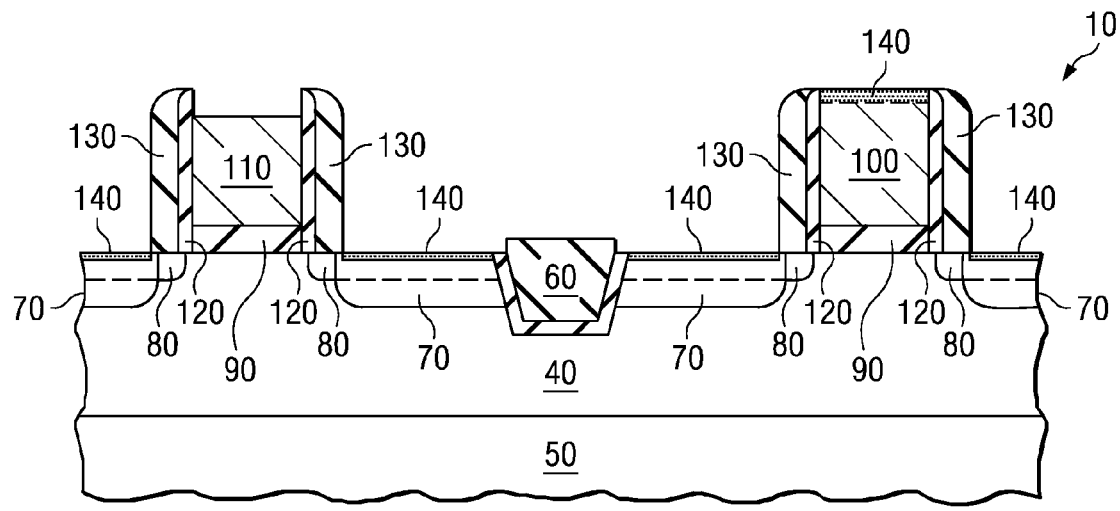
Figure 2L:
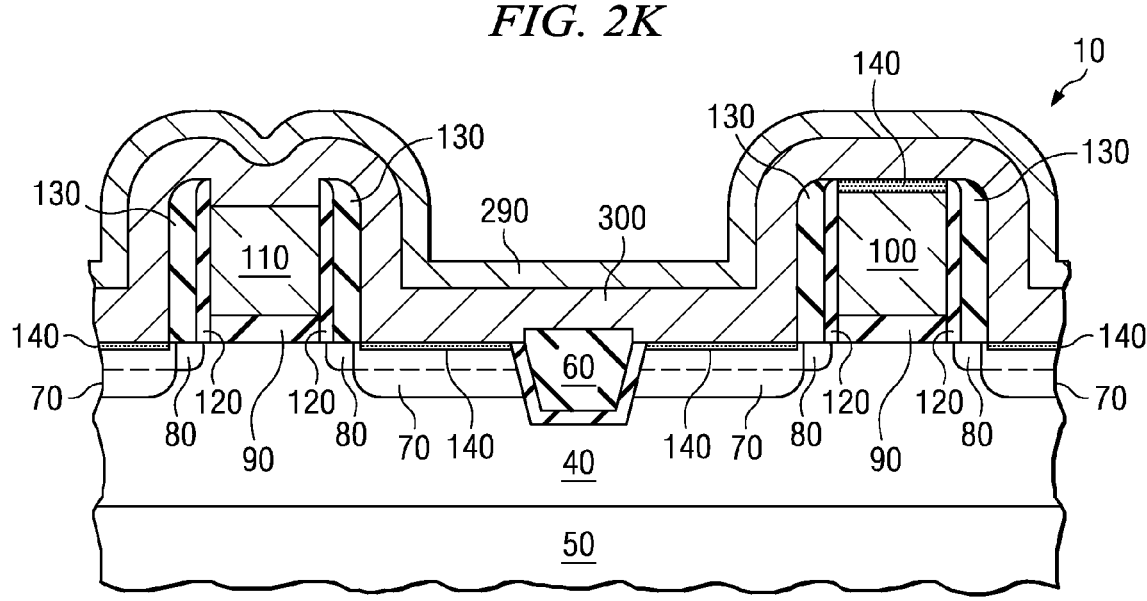
Figure 2M:
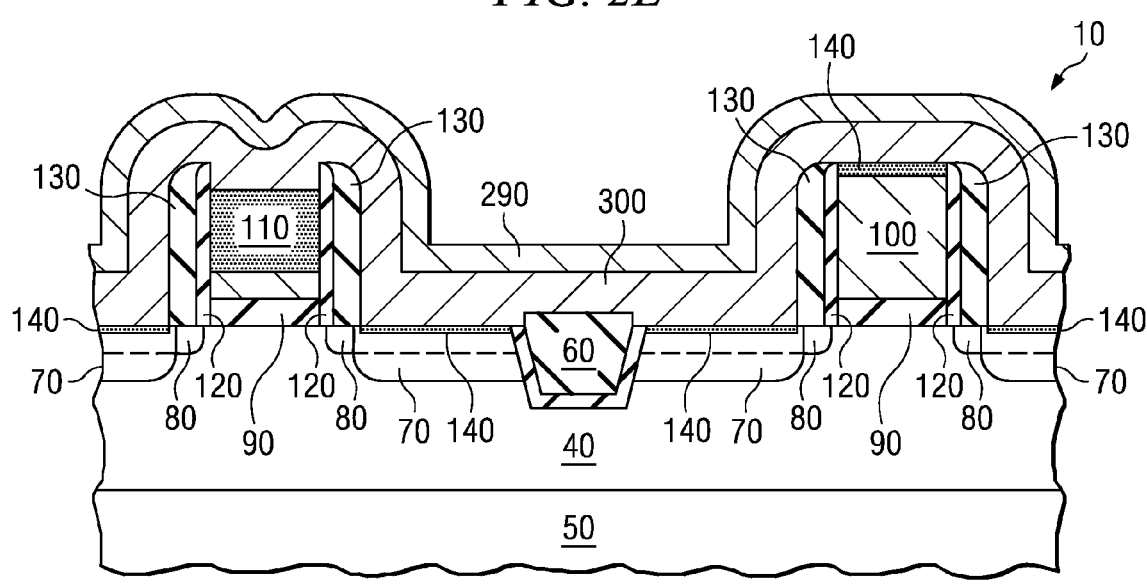
Figure 2N:
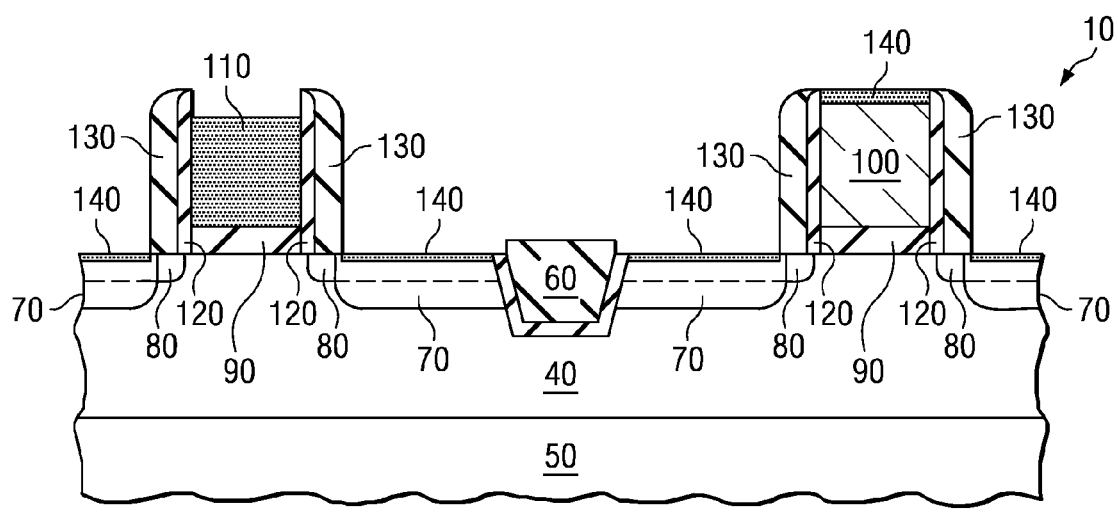

Referring again to the drawings, FIGS. 2A-2N are cross-sectional views of a partially fabricated integrated circuit 10 illustrating a process for forming example PMOS transistors 20, 30 in accordance with the present invention. As noted above, those skilled in the art of semiconductor fabrication will easily understand how to modify this process to manufacture other types of transistors (such as NMOS transistors) in accordance with this invention.

FIG. 2A is a cross-sectional view of the integrated circuit 10 where example PMOS transistors 20, 30 will be formed. The integrated circuit 10 contains the shallow trench isolation structures 60, the gate oxide layer 95, and the gate electrode layer 105, which are formed on the top surface of the n-well region 40 a semiconductor substrate 50. In the example application, the semiconductor substrate 50 is silicon; however any suitable material such as silicon germanium, germanium, or gallium arsenide may be used. The shallow trench isolation structures 60 are formed using any suitable known process.

The gate oxide layer 95 and the gate electrode layer 105 are also formed using well-known manufacturing techniques. The first layer formed over the surface of the semiconductor substrate 50 is a gate oxide layer 95. As an example, the gate oxide layer 95 is silicon dioxide that is formed with a thermal oxidation process. However, the gate oxide layer 95 may be any suitable material, such as nitrided silicon oxide, silicon nitride, or a high-k gate dielectric material, and it may be formed using any one of a variety of processes such as an oxidation process, thermal nitridation, plasma nitridation, physical vapor deposition ("PVD"), chemical vapor deposition ("CVD"), or atomic layer deposition ("ALD").

A gate electrode layer 105 is then formed on the surface of the gate oxide layer 95. The gate electrode layer 105 is comprised of polycrystalline silicon in the example application. However, it is within the scope of the invention to use other materials such as an amorphous silicon, a silicon alloy (e.g. SiGe), or other suitable materials. The gate electrode layer 105 may be formed using any suitable process technique such as CVD or PVD.

The next step in the example application is the formation of a gate protection layer 225 over the entire semiconductor wafer (i.e. over the gate electrode layer 105). Preferably, the gate protection layer is formed using a CVD process; however, any suitable process may be used. In the best mode application, the protection layer is comprised of silicon nitride. However, it is within the scope of the invention to form a gate protection layer 225 comprising a stack of materials, such as $SiO_2$, $Si_xN_y$, SiC, other metal nitrides, or combinations and stacks thereof. For example, the gate protection layer 225 may be comprised of silicon oxide layers above and below a silicon nitride layer. If used, the silicon oxide layers may serve as buffers for better process control.

Preferably, the gate protection layer 225 is at least 50 Å thick in order to protect the FUSI gate electrode layer 110 from being silicidized or oxidized during the integrated FUSI process, as described below. However, the thickness of the protection layer 225 may vary between 50-500 Å thick. In one example application, the silicon nitride gate protection layer 225 is deposited by a rapid thermal CVD process using silane or dichlorosilane and ammonia precursors.

A photoresist layer 230 is deposited over the gate protection layer 225 in order to pattern the gate stacks for transistors 20, 30. An suitable photoresist material may be used during this process. Alternatively, other materials may be used as the mask layer 230, such as silicon dioxide.

As shown in FIG. 2B, the photoresist layer 230 is patterned and etched so that the photoresist layer 230 covers the gate protection layer 225 corresponding to the FUSI metal gate transistor 30. Then, as shown in FIG. 2C, the portions of the gate protection layer 225 not covered by the patterned photoresist 230 are removed. Preferably, the exposed portions of the gate protection layer 225 are removed with a wet process that uses a $H_3PO_4$ etchant in a wet etch chamber having a temperature between 100-160° C. (but preferably at 130° C.). If oxide layers are used in the gate protection layer 225 then a wet etch process involving HF should be employed to remove the oxide layers. The photoresist 230 is then removed, as shown in FIG. 2C, using any suitable ashing process.

A gate stack 240 having no gate protection layer 220 ("unprotected gate stack") and a gate stack 250 having the gate protection layer 220 ("protected gate stack") are now formed. The unprotected and protected gate stacks, shown in FIG. 2D, may be created through a variety of processes. For example, the gate stacks 240, 250 may be created by forming a layer of standard photoresist 230 over the semiconductor substrate, patterning the photoresist, and then using the patterned photoresist to properly etch the gate oxide layer 95, the gate electrode layer 105, and the protection layer 225. The gate stacks 240, 250 may be etched using any suitable etch process, such as an anisotropic etch using plasma or reactive ions. After the pattern and etch process, an unprotected gate stack 240 having a gate oxide layer 90 and a gate electrode layer 100 will be formed from the gate oxide layer 95, the gate electrode layer 105 respectively. In addition, a protected gate stack 250 having a gate oxide layer 90, a gate electrode layer 110, and gate protection layer 220 will be formed from the gate oxide layer 95, the gate electrode layer 105, and the gate protection layer 225 respectively.

The next step in the fabrication of the PMOS transistors 20, 30 is the formation of the extension regions 80 using extension sidewalls 120 as a template. As shown in FIG. 2E, extension sidewalls 120 are formed on the outer surface of the gate stacks using any suitable processes and materials. The extension sidewalls 120 may be formed from a single material or may be formed from more than one layer of materials. For example, the extension sidewalls 120 may be comprised of an oxide, oxi-nitride, silicon dioxide, nitride, or any other dielectric material or layered stack of dielectric materials. The layers for the extension sidewalls 120 may be formed with any suitable process, such as thermal oxidation, or deposition by ALD, CVD, or PVD. Preferably, at least one layer of the extension sidewall 120 is comprised of a silicon nitride that is formed with a CVD process that uses a bis-1-butylaminosilane ("BTBAS") precursor. Forming the silicon nitride layer with that precursor will help guard against the etching of the extension sidewalls 120 during the process of removing the gate protection layer 220 later in the fabrication process (due to the low etch rate of BTBAS in the etching solution that is used for the protection layer removal). Usually, an anisotropic etch process is used to shape the extension sidewall layer or layers in to the extension sidewalls 120.

The extension sidewalls 120 are now used as a template to direct the proper placement of the extension regions 80, as shown in FIG. 2E. The extension regions 80 are formed near the top surface of the semiconductor substrate 50 using any standard process. For example, the extension regions 80 may be formed by low-energy ion implantation, gas phase diffusion, or solid phase diffusion. The dopants used to create the extension regions 80 for the PMOS transistors 20, 30 are p-type, such as boron. However, other dopants or combinations of dopants may be used.

At some point after the implantation of the extension regions 80, the extension regions 80 are activated by an anneal process (performed now or later) to form source/drain extension 80 (as shown in FIG. 2E). This anneal step may be performed with any suitable process such as rapid thermal anneal ("RTA").

Referring to FIG. 2F, spacer sidewalls 130 are now formed proximate to the extension sidewalls 120. The spacer sidewalls 130 may be formed using any standard process and materials. In addition the spacer sidewalls 130 may be formed from a single material or from two or more layers of materials. For example, the spacer sidewalls 130 may be comprised of a cap oxide and a BTBAS nitride layer that are formed with a CVD process and subsequently anisotropically etched (preferably using standard anisotropic plasma etch processes). However, it is within the scope of the invention to use more layers (i.e. an L-shaped cap oxide layer, an L-shaped nitride layer, and a final sidewall oxide layer) or less layers (i.e. just a silicon oxide layer or a silicon nitride layer) to create the spacer sidewalls 150. It is to be noted that the integrated circuit 10 is usually subjected to a standard post-etch cleaning process after the formation of the spacer sidewalls 130.

Now the source/drain sidewalls 130 are used as a template for the implantation of the source/drain regions 75. The source/drain regions 75 may be formed through any one of a variety of processes, such as deep ion implantation or deep diffusion. The dopants used to create the source/drain regions 75 for the PMOS transistors 20, 30 are typically boron; however, other dopants or combinations for dopants may be used.

In the example application, the source/drain regions 75 are activated by a second anneal step to create sources/drains 70. (However, the extension region anneal and the source/drain region anneal may be combined and performed at this point in the fabrication process). This anneal step acts to repair the damage to the semiconductor wafer and to activate the dopants. The activation anneal may be performed by an technique such as RTA, flash lamp annealing ("FLA"), or laser annealing. This anneal step often causes lateral and vertical migration of dopants in the source/drain extensions 80 and the sources/drains 70, as shown in FIG. 2G.

At this point in the fabrication process there are two transistor structures formed within the semiconductor substrate 50. Namely, an unprotected transistor stack 260 having the unprotected gate stack 240, and a protected transistor stack 270 having the protected gate stack 250.

As shown in FIG. 2H, a first layer of silicidation material 280 is now formed over the semiconductor substrate 50. The silicidation material 280 is preferably comprised of cobalt; however, other suitable materials such as nickel, platinum, titanium, tantalum, molybdenum, tungsten, or alloys may be used. In the example application, the cobalt first silicidation layer 280 is between 40-75 Å thick and is formed using a PVD process. Various other thicknesses could be used if the first layer of silicidation material 280 is one of the alternative metals, such as nickel.

An optional cap layer 290 may also be formed over the first layer of silicidation metal 280. If used, the cap layer 290 acts as a passivation layer that prevents the diffusion of oxygen from ambient into the first silicidation metal layer 280. The cap layer may be any suitable material, such as TiN. In the example application, the cap layer 290 is between 150-300 Å thick.

The integrated circuit 10 is now annealed with any suitable process, such as RTA. In the example application, the RTA is performed for 10-60 seconds at a temperature between 400-600° C.

This substrate silicide anneal process will cause a silicide 140 (i.e. a Co-rich silicide or Co mono-silicide) to form at the top surface of the gate electrode layer 100 of the unprotected transistor stack 260 and also at the top surface of the sources/drains 70 of both the protected transistor stacks 270 and the unprotected transistor stacks 260, as shown in FIG. 2I.

It is to be noted that the silicidation metal layer 140 will only react with the active substrate (i.e. the exposed Si); namely, the sources/drains 70 and the exposed polysilicon gate electrode layer 100. Therefore, the silicide 140 formed by the annealing process is a silicide. It is also important to note that the gate electrode 110 was not modified by the anneal process because the gate electrode 110 was protected by the gate protection layer 220 and the extension sidewalls 120.

The next step is the removal of the unreacted portions of the first layer of silicidation metal 280, as shown in FIG. 2J. The first layer of silicidation metal 280 (and the capping layer 290, if used) is removed with any suitable process such as a wet etch process (e.g. using a fluid mixture of sulfuric acid, hydrogen peroxide, and water).

It is within the scope of the invention to perform a second RTA at this point in the manufacturing process in order to further react the silicide 140 with the sources/drains 70 and the gate electrode layer 100. In the example application, a second silicide anneal is performed for 10-60 seconds at a temperature between 650-800° C. If the initial anneal process did not complete the silicidation process, this second anneal will ensure the formation of a mono-silicide CoSi, which lowers the sheet resistance of the silicide 140. It should be noted that the preferred temperature and time period for the second RTA process should be based on the silicide material used and the ability to form the silicidized sources/drains 70 and gate electrode 100 to be desired depth.

The gate protection layer 220 is now removed, as shown in FIG. 2K. The gate protection layer 220 may be removed by any suitable process such as a wet etch using a solution containing phosphoric acid at elevated temperatures in the range of 100-160° C. Alternatively, the gate protection layer can be removed by using a dilute HF solution at room temperature (i.e. 23° C.). With the gate protection layer 220 removed, the gate electrode 110 is now exposed and therefore available for gate electrode silicidation.

As shown in FIG. 2L, a second layer of silicidation metal 300 is now formed over the top of the semiconductor substrate 50. The second layer of silicidation metal 300 is preferably comprised of nickel; however, the other suitable materials such as cobalt, platinum, titanium, tantalum, molybdenum, tungsten, or an alloy may be used. Preferably, the second layer of silicidation metal 300 is designed to fully silicidize the polysilicon gate electrode layer 110. As it take approximately 10 Å of nickel to fully silicidize approximately 18 Å of polysilicon, the thickness of the silicidation metal 300 should be at least 56% of the thickness of the polysilicon gate electrode 110. To be comfortable however, it is suggested that the thickness of the silicidation metal 300 should be at least 60% of the thickness of the polysilicon gate electrode 110. Thus, where the thickness of the polysilicon gate electrode 110 ranges from about 600 Å to about 1500 Å in the example application, the thickness of the nickel second layer of silicidation metal 300 should range from approximately 400-2000 Å. However, various other thicknesses would be proper if the second layer of silicidation material 300 is one of the alternative metal materials.

An optional cap layer 290 may also be used over the second layer of silicidation metal 300. If used, the cap layer 290 acts as a passivation layer that prevents the diffusion of oxygen from the ambient into the second layer of silicidation metal 300. The cap layer may be any suitable material, such as TiN or Ti. In the example application, the cap layer 290 is between 150-300 Å thick.

The integrated circuit 10 is now annealed with any suitable process, such as RTA. In the example application, the gate silicide anneal is performed for 10-60 seconds at a temperature between 200-500° C. Once the first RTA of the gate silicide anneal is complete, the gate electrode 110 should be almost fully silicidized to a metal-rich phase, as shown in FIG. 2M. It is to be noted that the second layer of silicidation metal 300 will not react with the silicidized sources/drains 70 and the silicidized surface of the gate electrode layer 100 because they are protected from further silicidation by their previously formed silicide layer 140.

The next step is the removal of the unreacted portions of the second layer of silicidation metal 300, as shown in FIG. 2N. The second layer of silicidation metal 300 (and the capping layer 290, if used) is removed with any suitable process such as a selective wet etch process (i.e. using a fluid mixture of sulfuric acid, hydrogen peroxide, and water).

In the example application a second RTA is performed at this point in the manufacturing process in order to fully react the gate silicide 110, as shown in FIG. 2N. Preferably, the second RTA is performed for 30-120 seconds at a temperature between 400-600° C. This second anneal will ensure the formation of a fully silicidized gate electrode layer 110 having a lowered sheet resistance.

It is to be noted that the example fabrication process described above creates transistors having two different threshold voltages on the same integrated circuit 10. Specifically the poly gate transistors 20 will have one threshold voltage (that is determined by the doping levels of the polysilicon gate electrode 100 during the formation of the sources/drains and the source/drain extensions) and the FUSI gate transistors 30 will have a second (different) threshold voltage (that is determined by the work-function of the FUSI gate electrode). (The work-function of the FUSI gate transistors 30 will also be affected by the doping levels of the gate electrode 110 during the deposition of the sources/drains and the source/drain extensions).

It is also to be noted that the only one additional mask step (FIGS. 2A-2C) was used to create transistors with and without the gate protection layer 220 for both electrical parties (e.g. for NMOS and PMOS). It is within the scope of the invention to form multiple poly gate transistors 20 and multiple FUSI gate transistors 30 in the n-well regions, the p-well regions, or both the n-well and the p-well regions of the integrated circuit 10.

Figure 3A:
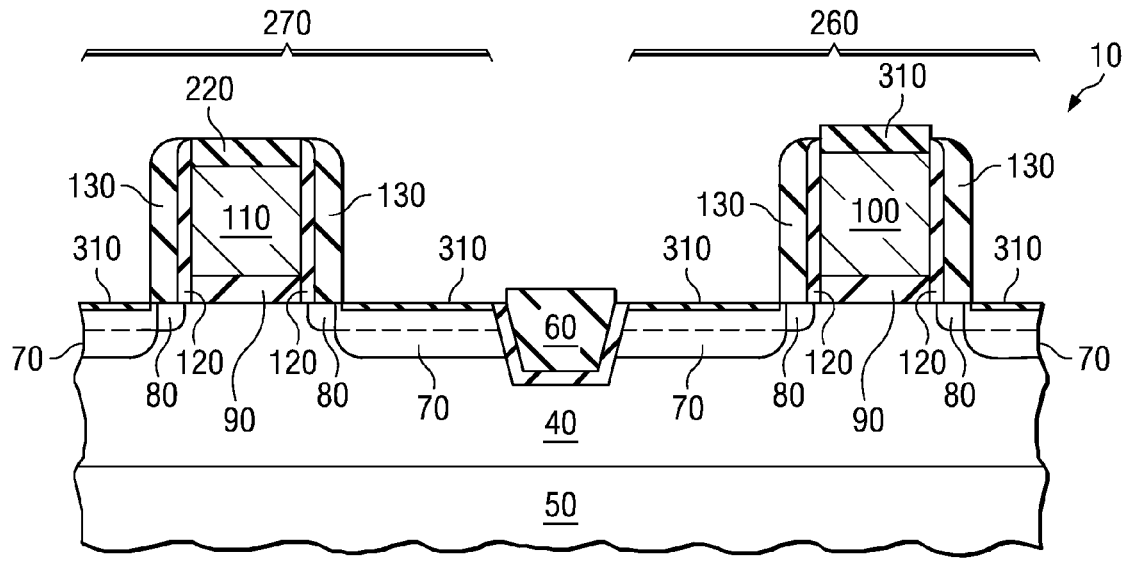
FIGS. 3A-3I are cross-sectional diagrams of a process for forming a poly gate transistor and a FUSI gate transistor in accordance with the present invention using an alternate process flow.

Other process flows for creating poly gate transistors 20 and FUSI gate transistors 30 in a single integrated circuit 10 are within the scope of the invention. For example, instead of forming the poly gate transistors 20 first and the FUSI gate transistors second; these transistors may be formed in the opposite order. A portion of this alternative process flow is shown in FIGS. 3A-3I. With this alternative manufacturing process, protected transistor stacks 270 and unprotected transistor stacks 260 may be formed using the process described above and shown in FIGS. 2A-2G. Next, as shown in FIG. 3A, a silicide blocking layer is formed over the active substrate (i.e. the exposed Si). More specifically, an oxide layer 310 is formed within the top surface of the gate electrode layer 100 of the unprotected transistor stack 260 and also within the top surface of the sources/drains 70 of both the protected transistor stacks 270 and the unprotected transistor stacks 260. Any suitable technique may be used to form the oxide layers 310. For instance, a low temperature oxidation process (e.g. a plasma oxidation process) may be performed within a low temperature range (i.e. 200° C. to 600° C.) to grow an oxide layer having a thickness between 50-100 Å. This process has the benefit of not changing the doping profile of the sources/drains 70 and the source/drain extensions 80.

Figure 3B:
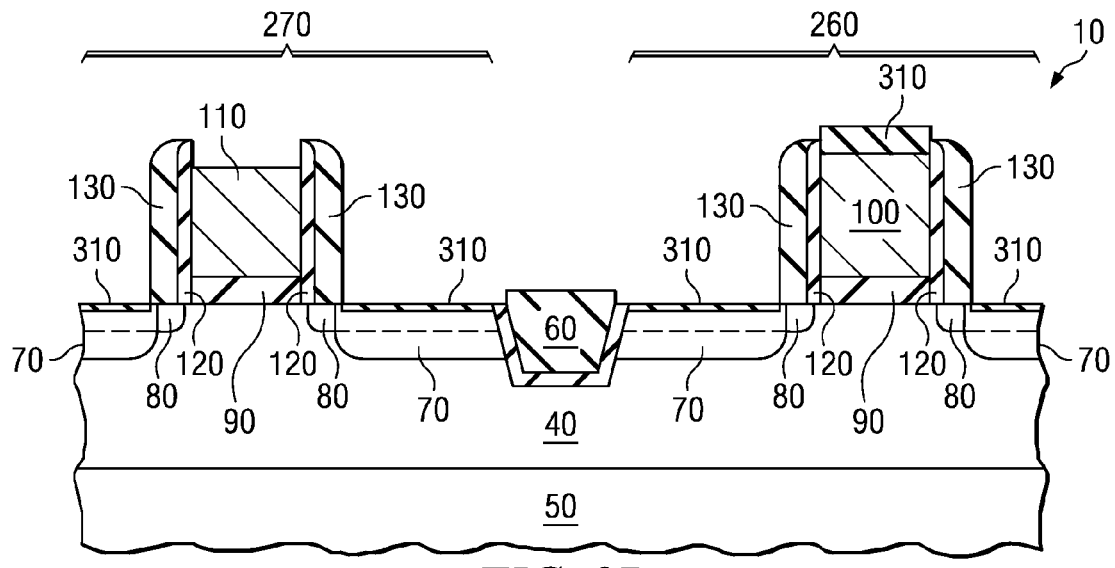

After the oxide layer 310 has been formed, the gate protection layer 220 is removed from the protected gate stack 270, as shown in FIG. 3B. The gate protection layer 220 may be removed by any suitable process such as a wet etch using a solution containing phosphoric acid at elevated temperatures in the range of 100-160°0 C. With the gate protection layer 220 removed, the gate electrode 110 is now exposed and therefore available for gate electrode silicidation. The oxide layer 310 is not affected by the wet etch process to remove the gate protection layer 220. Therefore, transistor stack 260 is still covered by the oxide layer 310.

Figure 3C:
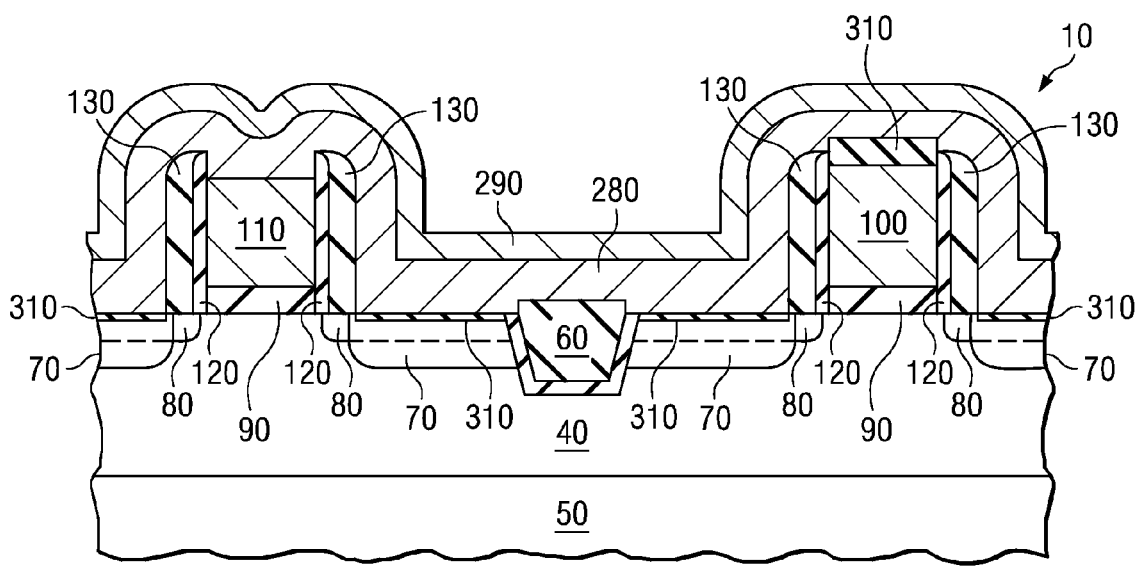

As shown in FIG. 3C, a first layer of silicidation metal 280 is now formed over the top of the semiconductor substrate 50. The first layer of silicidation metal 280 is preferably comprised of nickel; however, other suitable materials such as cobalt, platinum, titanium, tantalum, molybdenum, tungsten, or an alloy may be used. Preferably, the first layer of silicidation metal 280 is designed to fully silicidize the polysilicon gate electrode layer 110. As it takes approximately 10 Å of nickel to fully silicidize approximately 18 Å of polysilicon, the thickness of the silicidation metal 280 should be at least 56% of the thickness of the polysilicon gate electrode 110. To be comfortable however, it is suggested that the thickness of the silicidation metal 280 should be at least 60% of the thickness of the polysilicon gate electrode 110. Thus, where the thickness of the polysilicon gate electrode 110 ranges from about 600-1500 Å, in the example application, the thickness of the nickel first layer of silicidation metal 280 should range from approximately 400-2000 Å. However, various other thicknesses would be proper if the first layer of silicidation material 280 is one of the alternative metals.

An optional cap layer 290 may also be used over the first layer of silicidation metal 280. If used, the cap layer 290 acts as a passivation layer that prevents the diffusion of oxygen from the ambient into the first layer of silicidation metal 280. The cap layer may be any suitable material, such as TiN or Ti. In the example application, the cap layer 290 is between 150-300 Å thick.

Figure 3D:
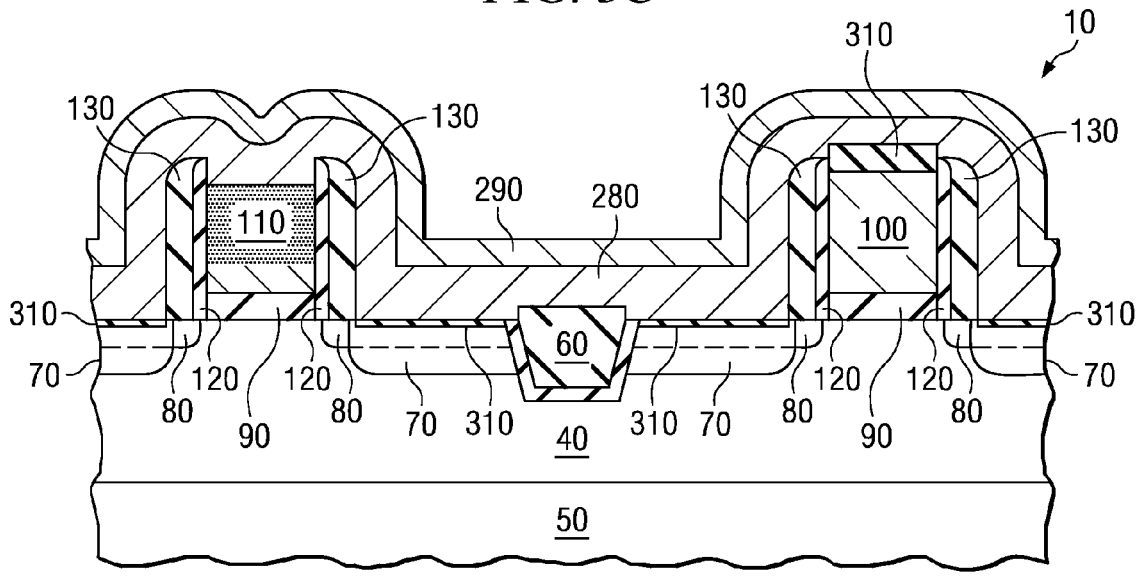

The integrated circuit 10 is now annealed with any suitable process, such as RTA. In the example application, the gate silicide anneal is performed for 1-60 seconds at a temperature between 200-500° C. Once the first RTA of the gate silicide anneal is complete, the gate electrode 110 should be almost fully silicidized to a metal-rich phase, as shown in FIG. 3D. It is to be noted that the first layer of silicidation metal 280 will not react with the oxidized sources/drains 70 and the oxidized surface of the gate electrode layer 100 because they are protected from silicidation by the previously formed oxide layer 310.

Figure 3E:
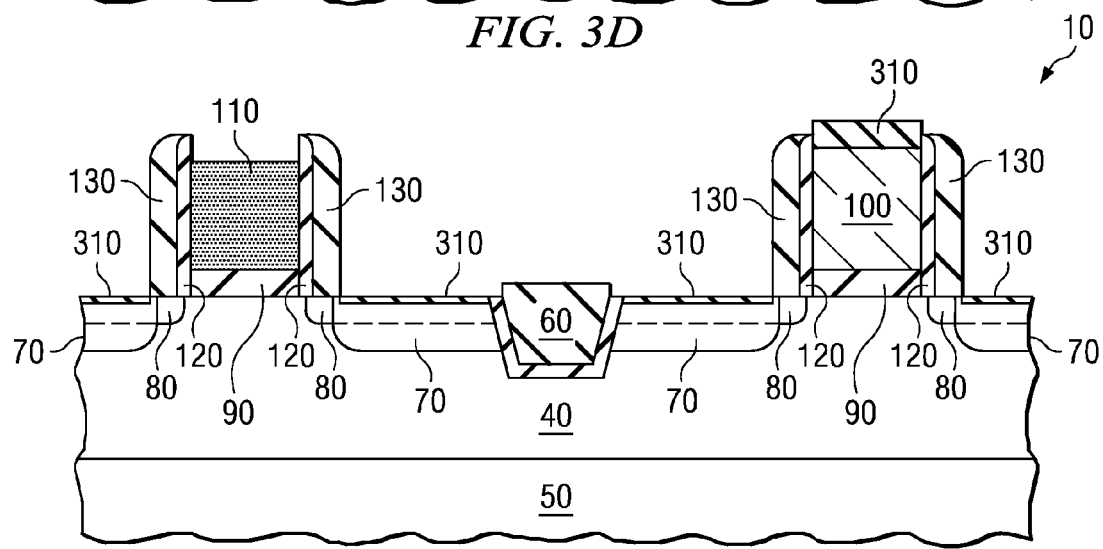

The next step is the removal of the unreacted portions of the first layer of silicidation metal 280, as shown in FIG. 3E. The first layer of silicidation metal 280 (and the capping layer 290, if used) is removed with any suitable process such as a selective wet etch process (i.e. using a fluid mixture of sulfuric acid, hydrogen peroxide, and water).

In the example application a second RTA is now performed in order to fully react the gate silicide 110, as shown in FIG. 3E. Preferably, the second RTA is performed for 30-120 seconds at a temperature between 400-600° C. This second anneal will ensure the formation of a fully silicidized gate electrode layer 110 having a lowered sheet resistance.

Figure 3F:
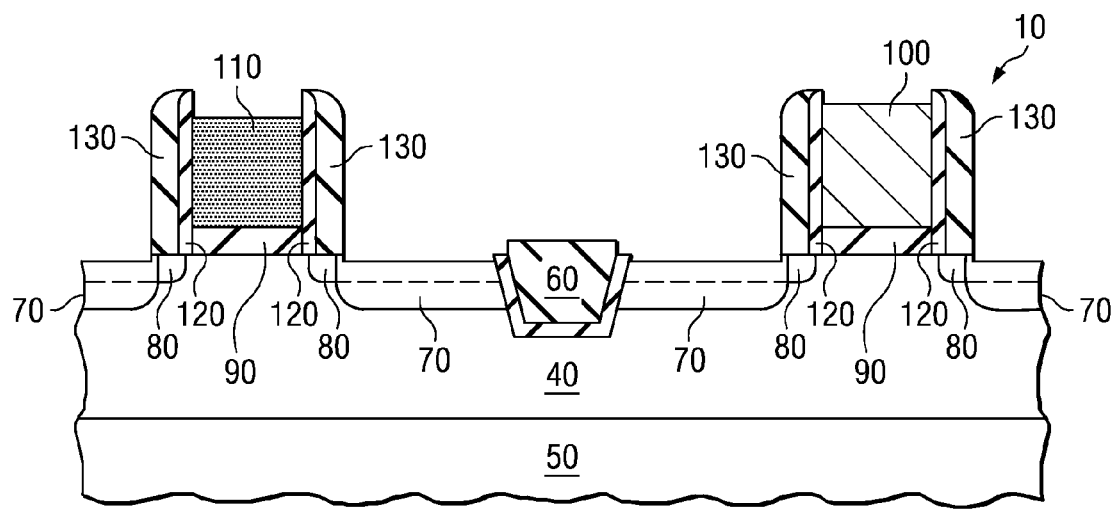

Now, the oxide layer 310 is also removed, as shown in FIG. 3F, using any suitable process. For example, the oxide layer may be removed with a dilute HF solution at room temperature. As shown in FIG. 3F, recesses will be formed at the locations where the oxide layer 310 were removed. Therefore, it is within the scope of the invention to form a silicide blocking layer 310 that won't consume active silicon (thereby creating the recesses when etched) by using other techniques and materials, such as high temperature oxidation technique (e.g. a rapid thermal oxidation technique). Alternatively, a selective thin epitaxial silicon layer may be deposited just prior to the formation of the oxide layer 310 to provide a sacrificial silicon layer to compensate for the silicon consumed by forming the oxide layer 310 with a low temperature oxidation process.

Figure 3G:
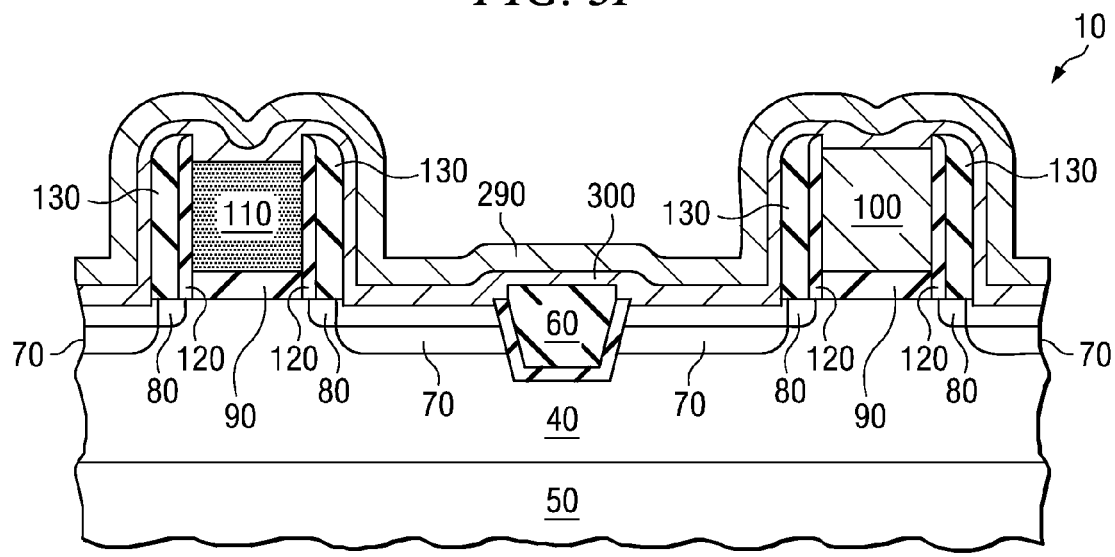

As shown in FIG. 3G, a second layer of silicidation material 300 is now formed over the semiconductor substrate 50. The silicidation material 300 is preferably comprised of nickel; however, other suitable materials such as cobalt, platinum, titanium, tantalum, molybdenum, tungsten, or alloys may be used. In the example application, the nickel second silicidation metal layer 300 is between 50-120 Å thick and is formed using a PVD process. Various other thicknesses could be used if the second layer of silicidation material 300 is one of the alternative metals, such as cobalt.

An optional cap layer 290 may also be formed over the second layer of silicidation metal 300. If used, the cap layer 290 acts as a passivation layer that prevents the diffusion of oxygen from ambient into the second silicidation metal layer 300. The cap layer may be any suitable material, such as TiN. In the example application, the cap layer 290 is between 150-300 Å thick.

The integrated circuit 10 is now annealed with any suitable process, such as RTA. In the example application, the RTA is performed for 1-60 seconds at a temperature between 200-500° C.

Figure 3H:
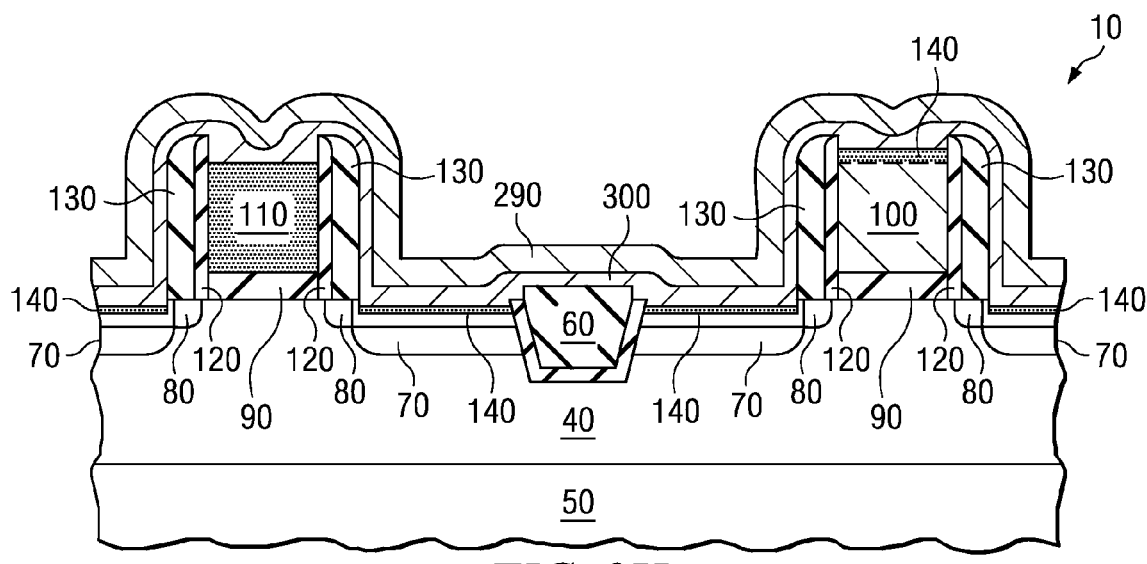

This substrate silicide anneal process will cause a silicide 140 (i.e. a Ni-rich silicide or Ni mono-silicide) to form at the top surface of the gate electrode layer 100 of the unprotected transistor stack 260 and also at the top surface of the sources/drains 70 of both the protected transistor stacks 270 and the unprotected transistor stacks 260, as shown in FIG. 3H.

It is to be noted that the silicidation metal layer 140 will only react with the active substrate (i.e. the exposed Si); namely, the sources/drains 70 and the exposed polysilicon gate electrode layer 100. Therefore, the silicide 140 formed by the annealing process is a salicide. It is also important to note that the gate electrode 110 was not modified by the anneal process because the gate electrode 110 was already fully silicidized.

Figure 3I:
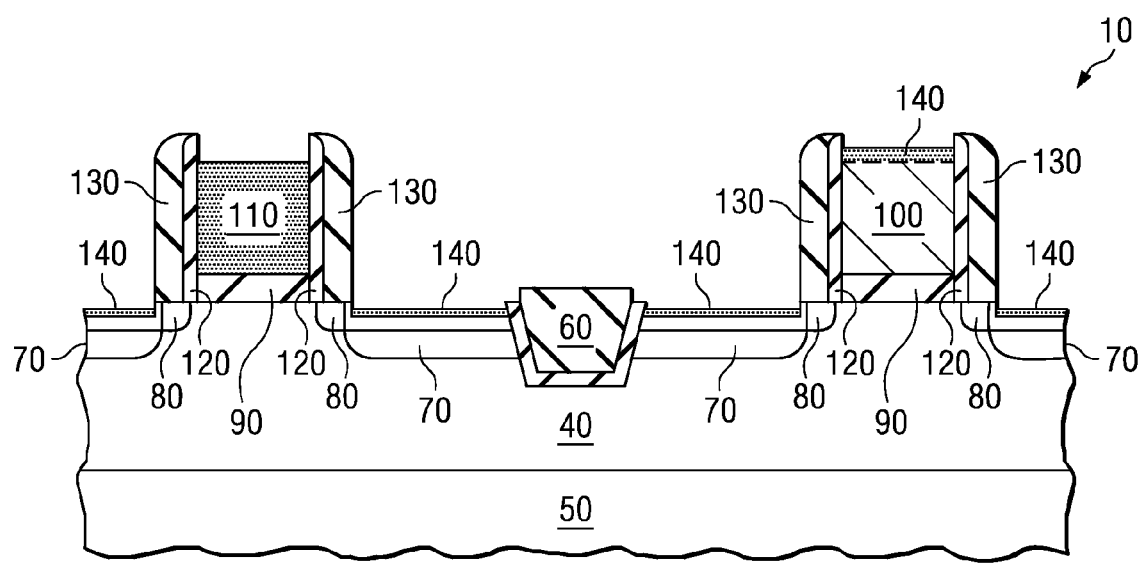

The next step is the removal of the unreacted portions of the second layer of silicidation metal 300, as shown in FIG. 3I. The second layer of silicidation metal 300 (and the capping layer 290, if used) is removed with any suitable process such as wet etch process (e.g. using a fluid mixture of sulfuric acid, hydrogen peroxide, and water).

It is within the scope of the invention to perform a second RTA at this point in the manufacturing process in order to further react the silicide 140 with the sources/drains 70 and the gate electrode layer 100. In the example application, a second silicide anneal is performed for 10-60 seconds at a temperature between 300-600° C. If the initial anneal process did not complete the silicidation process, this second anneal will ensure the formation of a mono-silicide NiSi, which lowers the sheet resistance of the silicide 140. It should be noted that the preferred temperature and time period for the second RTA process should be based on the silicide material used and the ability to form the silicidized sources/drains 70 and gate electrode 100 to the desired depth.

After the formation of FUSI gate electrode 110, as well as the silicide layers within the source/drain 70 and the gate electrode layer 100, using any process flow described above, the fabrication of the integrated circuit 10 now continues, using standard process steps, until the integrated circuit is complete. Generally, the next step is the formation of the dielectric insulator layer 150 (see FIG. 1) using plasma-enhanced chemical vapor deposition ("PECVD") or another suitable process. The dielectric insulator 150 may be comprised of any suitable material such as $SiO_2$ or OSG.

The contacts 160/170 are formed by etching the dielectric insulator layer 150 to expose the desired gate, source and/or drain. The etched spaces are usually filled with a contact liner 170 to improve the electrical interface between the silicide and the contact core 160. Then contact cores 160 are formed within the liner 170; creating the electrical interconnections between various electrical components located within the semiconductor substrate 50.

The fabrication of the final integrated circuit continues with the fabrication of the back-end structure using any suitable well-known processes. Once the fabrication process is complete, the integrated circuit 10 will be tested and then cut from the semiconductor wafer and packaged.

Various additional modifications to the invention as described above are within the scope of the claimed invention. For example, instead of forming the protected and unprotected transistor stacks as described above in relation to FIGS. 2A-2G, the protected and unprotected transistor stacks may be formed with any suitable process that uses only one additional mask step, such as the process shown in FIGS. 4A-4I. Analogous reference number to those used in prior drawing FIGS. 1-3I are used in FIGS. 4A-4I.

Figure 4A:
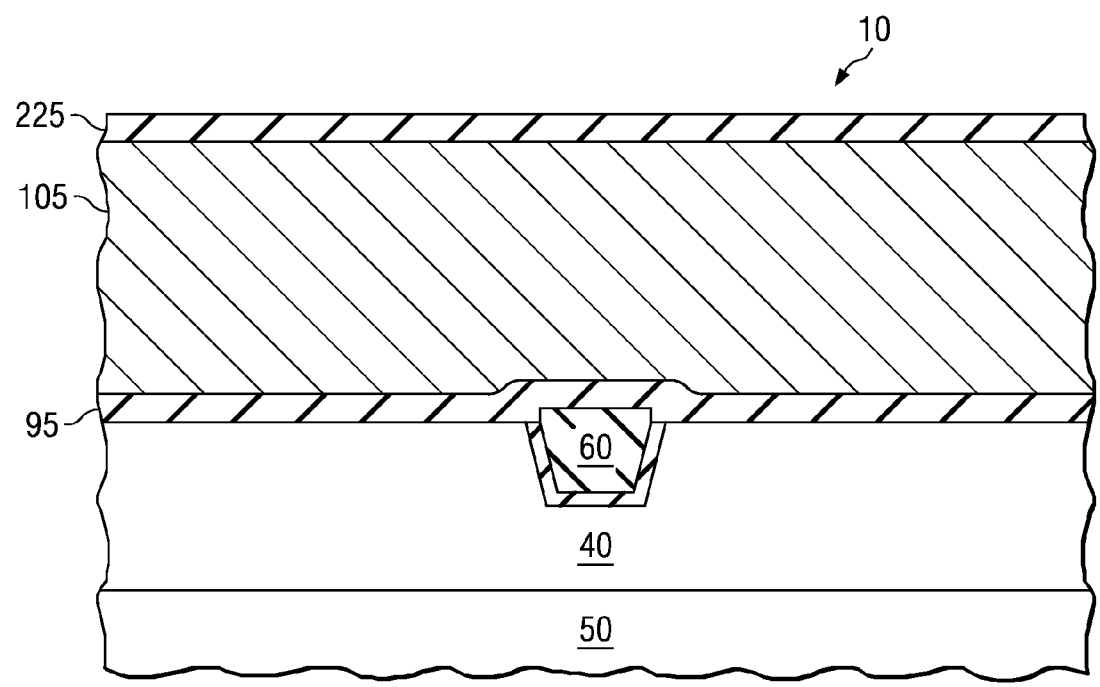
FIGS. 4A-4I are cross-sectional diagrams of a process for forming protected and unprotected transistor stacks in accordance with the present invention.
Figure 4B:
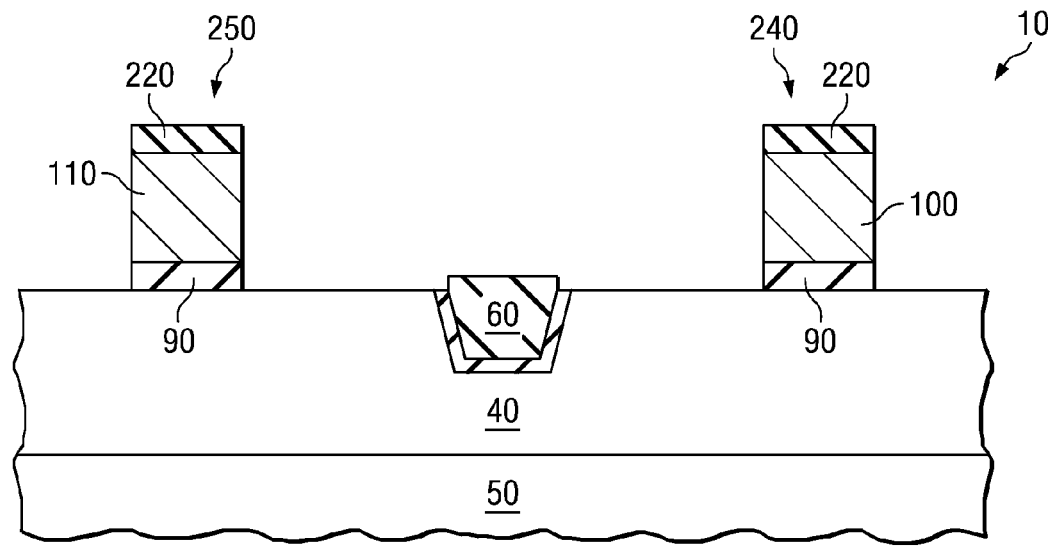

FIG. 4A is a cross sectional view of the integrated circuit 10 where example PMOS transistors 20, 30 will be formed. The integrated circuit 10 contains the shallow trench isolation structures 60, the gate oxide layer 95, and the gate electrode layer 105, which are formed on the top surface of the n-well region 40 a semiconductor substrate 50. In the example application, the semiconductor substrate 50 is silicon; however any suitable material such as silicon germanium, germanium, or gallium arsenide may be used. The shallow trench isolation structures 60 are formed using any suitable known process.

The gate oxide layer 95 and the gate electrode layer 105 are also formed using well-known manufacturing techniques. The first formed over the surface of the semiconductor substrate 50 is a gate oxide layer 95. As an example, the gate oxide layer 95 is silicon dioxide that is formed with a thermal oxidation process. However, the gate oxide layer 95 may be any suitable material, such as nitrided silicon oxide, silicon nitride, or a high-k gate dielectric material, and it may be formed using any one of a variety of processes such as an oxidation process, thermal nitridation, plasma nitridation, PVD, CVD, or ALD.

A gate electrode layer 105 is then formed on the surface of the gate oxide layer 95. The gate electrode layer 105 is comprised of polycrystalline silicon in the example application. However, it is within the scope of the invention to use other materials such as an amorphous silicon, a silicon alloy (e.g. SiGe), or other suitable materials. The gate electrode layer 105 may be formed using any suitable process technique such as CVD or PVD.

The next step in the example application is the formation of a gate protection layer 225 over the entire semiconductor wafer (i.e. over the gate electrode layer 105). Preferably, the gate protection layer is formed using a CVD process; however, any suitable process may be used. Preferably, the protection layer is comprised of silicon nitride. However, it is within the scope of the invention to form a gate protection layer 225 comprising a stack of materials, such as $SiO_2$, $Si_xN_y$, SiC, other metal nitrides, or combinations and stacks thereof. For example, the gate protection layer 225 may be comprised of silicon oxide layers above and below a silicon nitride layer. If used, the silicon oxide layers may serve as buffers for better process control.

Preferably, the gate protection layer 225 is at least 50 Å thick in order to protect the FUSI gate electrode layer 110 from being silicidized or oxidized during the integrated FUSI process, as described below. However, the thickness of the protection layer 225 may vary between 50-500 Å thick. In the example application, the silicon nitride gate protection layer 225 is deposited by a rapid thermal CVD process using silane or dichlorosilane and ammonia precursors.

The gate stack 240 for the unprotected transistor stack 260 and the gate stack 250 for the protected transistor stack 270 are now formed. The unprotected and protected gate stacks, shown in FIG. 4B, may be created through a variety of processes. For example, the gate stacks 240, 250 may be created by forming a layer of standard photoresist 230 over the semiconductor substrate, patterning the photoresist, and then using the patterned photoresist to properly etch the gate oxide layer 95, the gate electrode layer 105, and the protection layer 225. The gate stacks 240, 250 may be etched using a suitable etch process, such as an anisotropic etch using plasma or reactive ions. After the pattern and etch process, a protected gate stack 250 having a gate oxide layer 90, a gate electrode layer 110, and gate protection layer 220 will be formed from the gate oxide layer 95, the gate electrode layer 105, and the gate protection layer 225 respectively. Similarly, an unprotected gate stack 240 having gate oxide layer 90, a gate electrode layer 100, and a gate protection layer 220 will be formed from the gate oxide layer 95, the gate electrode layer 105, and the gate protection layer 225 respectively.

Figure 4C:
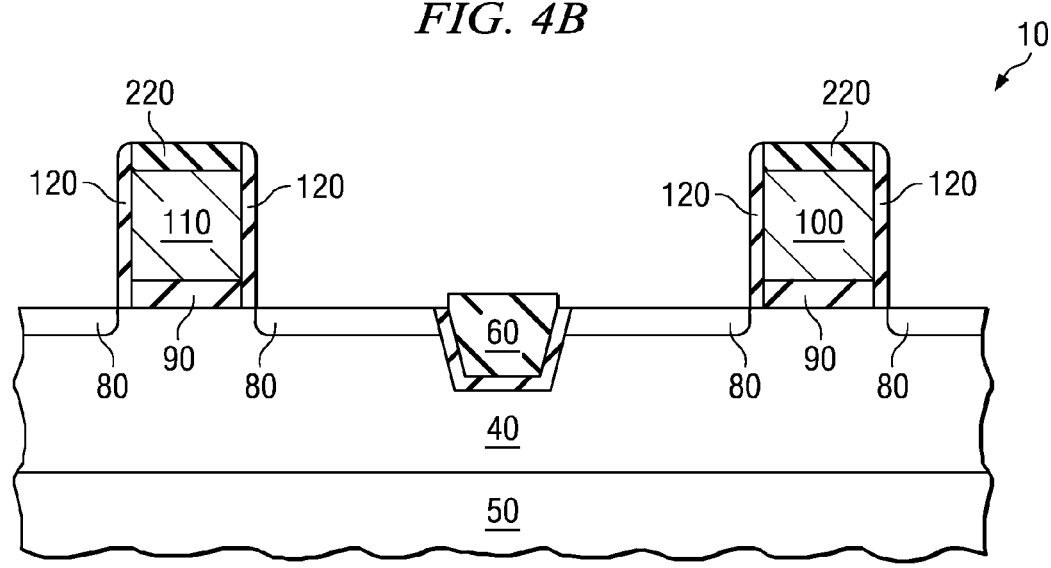

The next step in the fabrication of the PMOS transistors 20, 30 is the formation of the extension regions 80 using extension sidewalls 120 as a template. As shown in FIG. 4C, extension sidewalls 120 are formed on the outer surface of the gate stacks using any suitable processes and materials. The extension sidewalls 120 may be formed from a single material or may be formed from more than one layer of materials. For example, the extension sidewalls 120 may be comprised of an oxide, oxi-nitride, silicon dioxide, nitride, or any other dielectric material or layered stack of dielectric materials. The layers for the extension sidewalls 120 may be formed with any suitable process, such as thermal oxidation, or deposition by ALD, CVD, or PVD. Preferably, at least one layer of the extension sidewall 120 is comprised of a silicon nitride that is formed with a CVD process that uses a BTBAS precursor. Forming the silicon nitride layer with that precursor will help guard against the etching of the extension sidewalls 120 during the process of removing the gate protection layer 220 later in the fabrication process (due to the low etch rate of BTBAS in the etching solution that is used for the protection layer removal). Usually, an anisotropic etch process is used to shape the extension sidewall layer or layers into the extension sidewalls 120.

The extension sidewalls 120 are now used as a template to direct the proper placement of the extension regions 80, as shown in FIG. 4C. The extension regions 80 are formed near the top surface of the semiconductor substrate 50 using any standard process. For example, the extension regions 80 may be formed by low-energy ion implantation, gas phase diffusion, or solid phase diffusion. The dopants used to create the extension regions 80 for the PMOS transistors 20, 30 are p-type, such as boron. However, other dopants or combinations of dopants may be used.

At some point after the implantation of the extension regions 80, the extension regions 80 are activated by an anneal process (performed now or later) to from source/drain extensions 80 (as shown in FIG. 4C). This anneal step may be performed with any suitable process such as RTA.

Figure 4D:
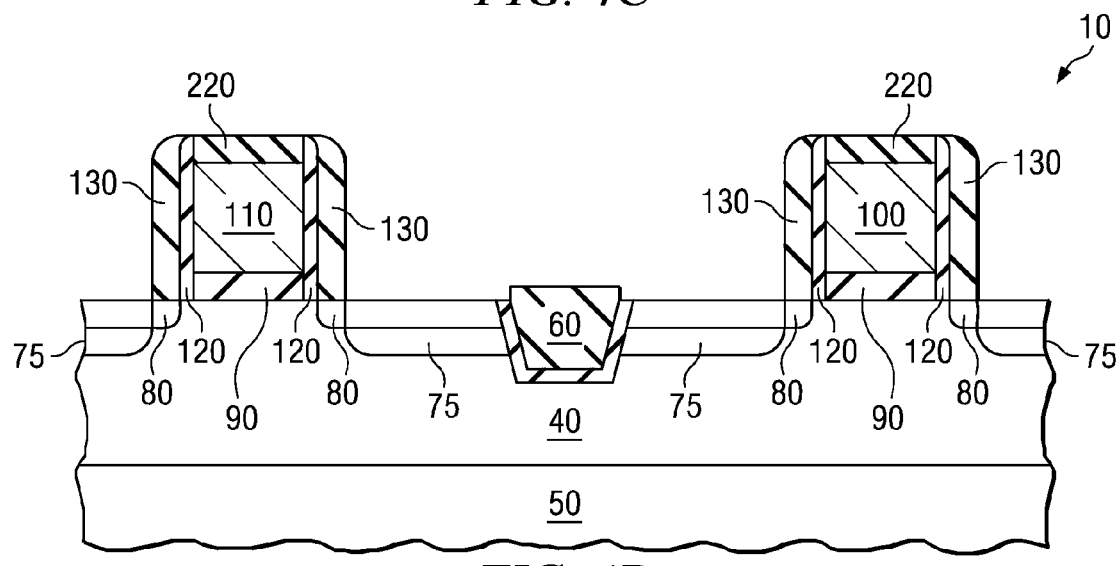

Referring to FIG. 4D, spacer sidewalls 130 are now formed proximate to the extension sidewalls 120. The spacer sidewalls 130 may be formed using any standard process and materials. In addition the spacer sidewalls 130 may be formed from a single material or from two or more layers of materials. For example, the spacer sidewalls 130 may be comprised of a cap oxide and a BTBAS nitride layer that are formed with a CVD process and subsequently anisotropically etched (preferably using standard anisotropic plasma etch processes). However, it is within the scope of the invention to use more layers (i.e. an L-shaped cap oxide layer, an L-shaped nitride layer, and a final sidewall oxide layer) or less layers (i.e. just a silicon oxide layer or a silicon nitride layer) to create the spacer sidewalls 150. It is to be noted that the integrated circuit 10 is usually subjected to a standard post-etch cleaning process after the formation of the spacer sidewalls 130.

Now the source/drain sidewalls 130 are used as a template for the implantation of the source/drain regions 75. The source/drain regions 75 may be formed through any one of a variety of processes, such as deep ion implantation or deep infusion. The dopants used to create the source/drain regions 75 for the PMOS transistors 20, 30 are typically boron; however, other dopants or combinations for dopants may be used.

Figure 4E:
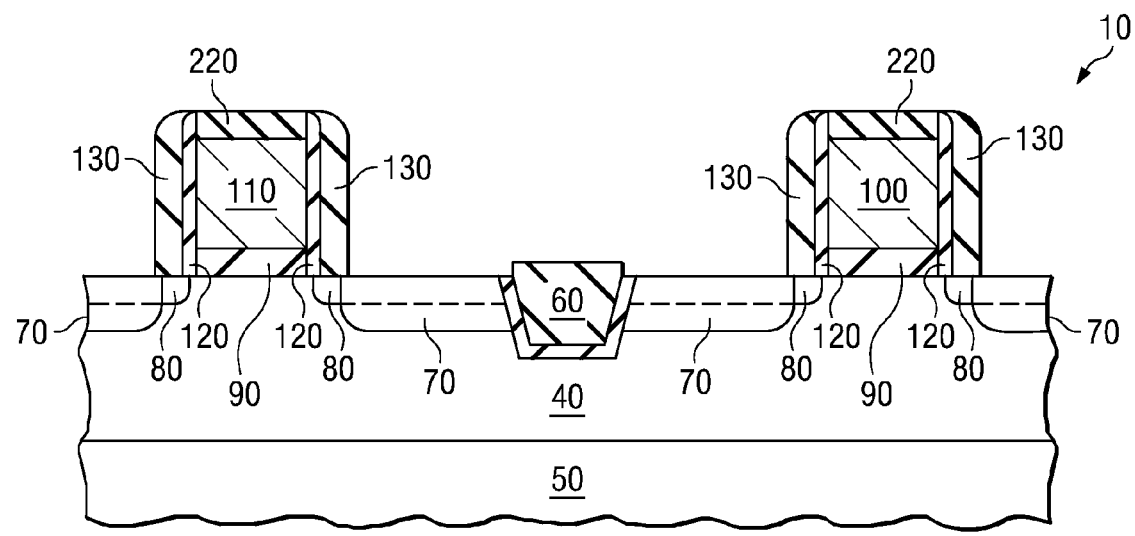

In the example application, the source/drain regions 75 are activated by a second anneal step to create sources/drains 70. (However, the extension region anneal and the source/drain region anneal may be combined and performed at this point in the fabrication process). This anneal step acts to repair the damage to the semiconductor wafer and to activate the dopants. The activation anneal may be performed by an technique such as RTA, FLA, or laser annealing. This anneal step often causes lateral and vertical migration of dopants in the source/drain extensions 80 and the sources/drains 70, as shown in FIG. 4E.

Figure 4F:
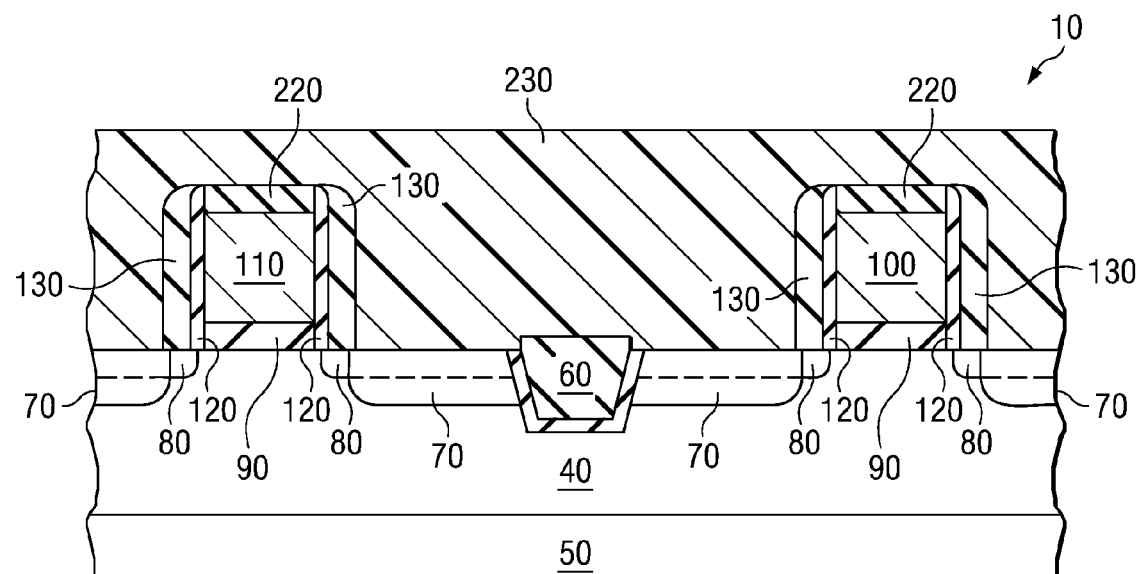
Figure 4G:
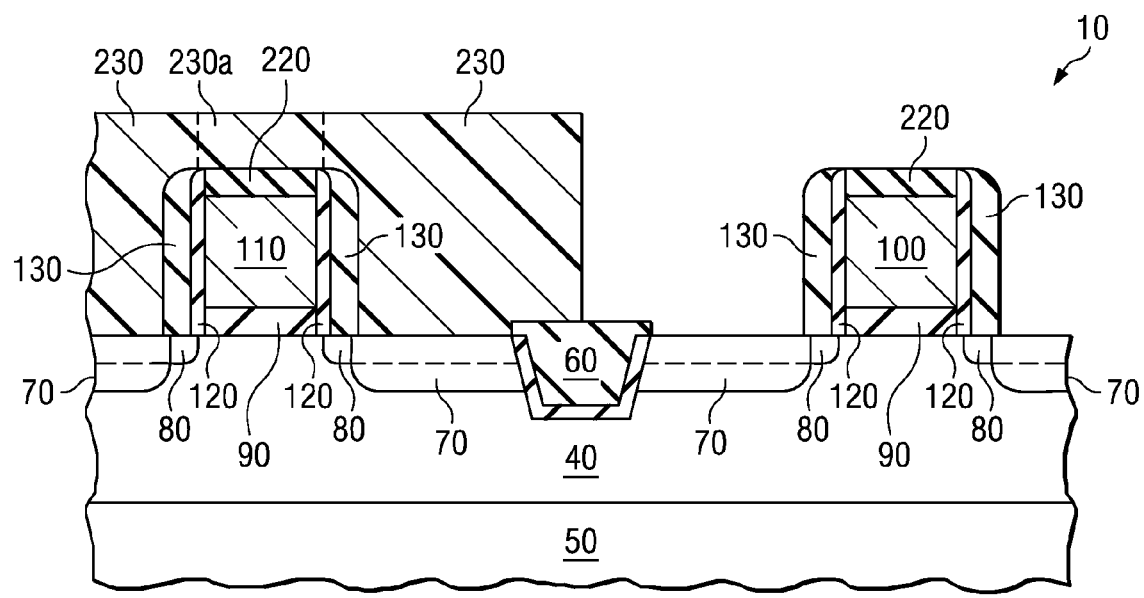

As shown in FIG. 4F, a photoresist layer 230 is now formed over the semiconductor substrate 50. Any suitable photoresist material may be used during this process. Alternatively, other materials may be used as the mask layer 230, such as silicon dioxide. The single mask step will facilitate the formation of all protected transistor stacks 270 and unprotected transistor stacks 260 throughout the integrated circuit 10.

Figure 4H:
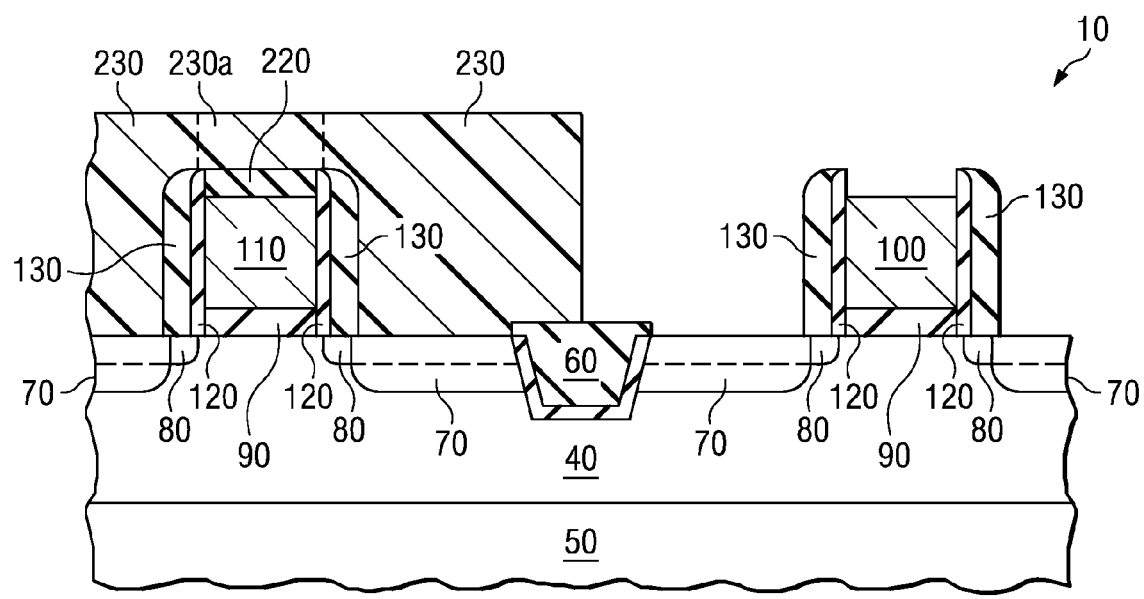
Figure 4I:
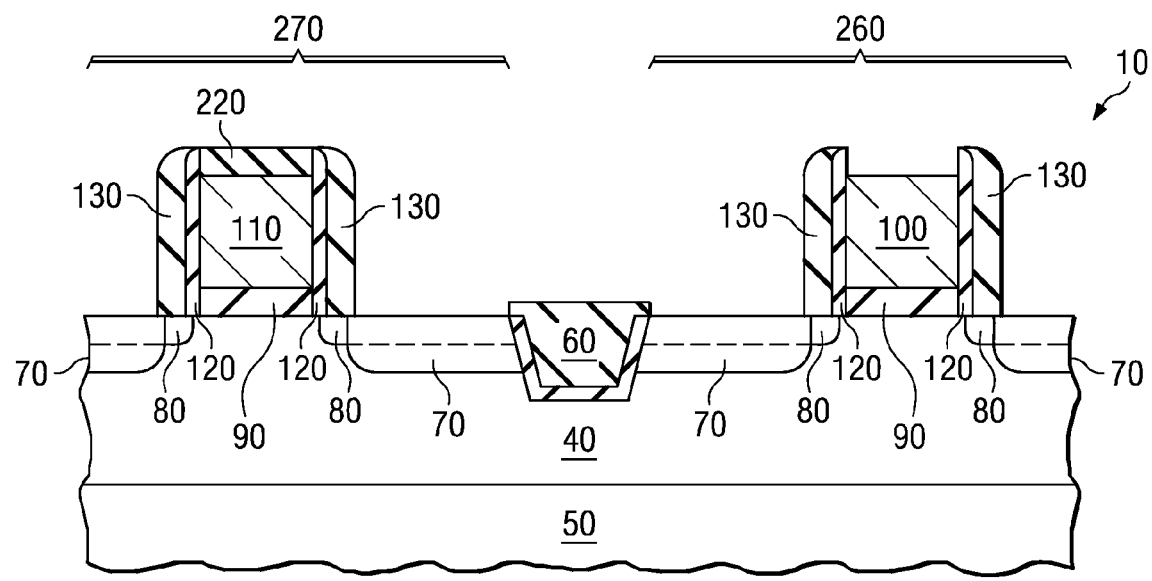

As shown in FIG. 5G, the photoresist layer 230 is patterned and etched so that the photoresist layer 230 covers the PMOS FUSI metal gate transistor 30. Alternatively, the photoresist layer could be patterned to cover just the gate protection layer 225 overlying the FUSI metal gate transistor 30 (i.e. 230a, as indicated by the dashed lines). Then, as shown in FIG. 4H, the portions of the gate protection layer 225 not covered by the patterned photoresist 230 or 230a (specifically, the gate protection layers 225 belonging to the unprotected transistor stacks 260) are removed. Preferably, the exposed portions of the gate protection layer 225 are removed with a wet process that uses a $H_3PO_4$ etchant in a wet etch chamber having a temperature between 100-160° C. (and preferably around 130° C.). If oxide layers are used in the gate protection layer 225 then a wet etch process involving HF should be employed to remove the oxide layers. Next, the photoresist 230 is removed, as shown in FIG. 4I, using any suitable ashing process.

At this point in the fabrication process there are two transistor structures formed within the semiconductor substrate 50. Namely, an unprotected transistor stack 260 having the unprotected gate stack 240, and a protected transistor stack 270 having the protected gate stack 250. The fabrication of the integrated circuit now continues with the process step corresponding to FIG. 2H or the process step corresponding to FIG. 3A.

Various additional modifications to the invention as described above are within the scope of the claimed invention. As an example, interfacial layers may be formed between any of the layers shown. In addition, an anneal process may be performed after any step in the above-described fabrication process. When used, the anneal process can improve the microstructure of materials and thereby improve the quality of the semiconductor structure. Conversely, any anneal process used in the example application may be removed. For example, if a FUSI gate electrode can be formed with one RTA process (FIGS. 2M and 3D) then the second RTA step can be deleted from the process flow in order to save manufacturing costs.

While various embodiments of the present invention have been described above, it should be understood that they have been presented by way of example only, and not limitation. Numerous changes to the disclosed embodiments can be made in accordance with the disclosure herein without departing from the spirit of scope of the invention. Thus, the breadth and scope of the present invention should not be limited by any of the above described embodiments. Rather, the scope of the invention should be defined in accordance with the following claims and their equivalents.

What is claimed is:

1. A method for manufacturing an integrated circuit, comprising:

forming protected transistor stacks and unprotected transistor stacks on a semiconductor substrate, said protected transistor stacks having a gate protection layer that is formed with the use of a single mask step;

forming an oxide layer within a top surface of a gate electrode layer of said unprotected transistor stacks and within a top surface of sources/drains of said protected and said unprotected transistor stacks;

removing said gate protection layer from said protected transistor stacks;

forming a first layer of silicidation metal over said semiconductor substrate;

performing a gate silicide anneal to create a fully silicidized gate electrode layer within said protected transistor stacks;

removing said oxide layer;

forming a second layer of silicidation metal over said semiconductor substrate; and performing a substrate silicide anneal to create a silicide within a top surface of a gate electrode of said unprotected transistor stacks and within a top surface of sources/drains of said protected and said unprotected transistor stacks.

2. The method of claim 1 wherein said protected and said unprotected transistor stacks are formed within at least one n-well region of said semiconductor substrate.

3. The method of claim 1 wherein said protected and said unprotected transistor stacks are formed within at least one p-well region of said semiconductor substrate.

4. The method of claim 1 wherein said protected and said unprotected transistor stacks are formed within at least one n-well region and within at least one p-well region of said semiconductor substrate.

5. The method of claim 1 wherein the method for forming said protected transistor stacks and said unprotected transistor stacks on a semiconductor substrate comprises:
   providing said semiconductor substrate;
   forming a gate oxide layer over said semiconductor substrate;
   forming said gate electrode layer over said gate oxide layer, said gate electrode layer including polysilicon material;
   forming said gate protection layer over said gate electrode layer;
   forming a photoresist layer over said gate protection layer;
   patterning said photoresist layer to cover portions of said gate protection layer located over said protected transistor stacks;
   removing portions of said gate protection layer not covered by said patterned photoresist;
   removing said patterned photoresist;
   forming unprotected gate stacks and protected gate stacks, said unprotected gate stacks having said gate oxide layer and said gate electrode layer, said protected gate stacks having said gate oxide layer, said gate electrode layer, and said gate protection layer;
   forming extension sidewalls coupled to said unprotected gate stacks and said protected gate stacks;
   implanting extension regions within a top surface of said semiconductor substrate;
   forming spacer sidewalls coupled to said extension sidewalls;
   implanting source/drain regions within a top surface of said semiconductor substrate; and
   annealing said semiconductor substrate to create sources/drains.

6. The method of claim 1 wherein the method for forming said protected transistor stacks and said unprotected transistor stacks on a semiconductor substrate comprises:
   providing said semiconductor substrate;
   forming a gate oxide layer over said semiconductor substrate;
   forming a gate electrode layer over said gate oxide layer, said gate electrode layer including polysilicon material;
   forming said gate protection layer over said gate electrode layer;
   forming protected gate stacks and unprotected gate stacks, said protected and said unprotected gate stacks having said gate oxide layer, said gate electrode layer, and said gate protection layer;
   forming extension sidewalls coupled to said protected and said unprotected gate stacks;
   implanting extension regions within a top surface of said semiconductor substrate;
   forming spacer sidewalls coupled to said extension sidewalls;
   implanting source/drain regions within a top surface of said semiconductor substrate;
   annealing said semiconductor substrate to create sources/drains;
   forming a photoresist layer over said semiconductor substrate;
   patterning said photoresist layer to cover said gate protection layer of said protected gate stacks;
   removing said gate protection layer from said unprotected gate stacks;
   removing said patterned photoresist.

7. The method of claim 1 wherein said gate protection layer includes silicon nitride.

8. The method of claim 1 wherein said step of performing a substrate silicide anneal comprises:
   performing a first rapid thermal anneal;
   etching said semiconductor substrate to remove unreacted portions of said second layer of silicidation metal; and
   performing a second rapid thermal anneal.

9. The method of claim 1 wherein said second layer of silicidation metal comprises nickel.

10. The method of claim 1 further comprising the step of forming a cap layer over said second layer of silicidation metal prior to said step of performing a substrate silicide anneal.

11. The method of claim 10 wherein said cap layer comprises titanium nitride.

12. The method of claim 1 wherein said step of performing a gate silicide anneal comprises:
   performing a first rapid thermal anneal;
   etching said semiconductor wafer to remove unreacted portions of said first layer of silicidation metal; and
   performing a second rapid thermal anneal.

13. The method of claim 1 wherein said first layer of silicidation metal comprises nickel.

14. The method of claim 1 further comprising the step of forming a cap layer over said first layer of silicidation metal prior to said step of performing a gate silicide anneal.

15. The method of claim 14 wherein said cap layer comprises titanium nitride.

16. The method of claim 1 wherein said step of removing said gate protection layer comprises a wet etch process using a phosphoric acid solution.

17. The method of claim 1 wherein said step of removing said oxide layer comprises a HF deglaze process.

18. The method of claim 1 wherein said silicide is a self-aligned silicide.

* * * * *